US008581964B2

(12) United States Patent
Sul et al.

(10) Patent No.: US 8,581,964 B2
(45) Date of Patent: Nov. 12, 2013

(54) THREE-DIMENSIONAL IMAGE SENSORS AND METHODS OF MANUFACTURING THE SAME

(75) Inventors: Sang-Chul Sul, Suwon-si (KR); Won-Cheol Jung, Seoul (KR); Yoon-Dong Park, Yongin-si (KR); Myung-Bok Lee, Suwon-si (KR); Young-Gu Jin, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 470 days.

(21) Appl. No.: 12/905,458

(22) Filed: Oct. 15, 2010

(65) Prior Publication Data
US 2011/0102547 A1    May 5, 2011

(30) Foreign Application Priority Data

Nov. 4, 2009   (KR) .................. 10-2009-0105800

(51) Int. Cl.
 *H04N 7/18*    (2006.01)
(52) U.S. Cl.
 USPC ............................................. 348/49; 348/46
(58) Field of Classification Search
 USPC .................................. 257/E31.1; 348/42–60
 See application file for complete search history.

(56) References Cited

U.S. PATENT DOCUMENTS

| | | | |
|---|---|---|---|
| 6,759,646 B1 * | 7/2004 | Acharya et al. | 250/226 |
| 7,560,679 B1 * | 7/2009 | Gutierrez | 250/208.1 |
| 7,615,322 B2 * | 11/2009 | Kwon et al. | 430/7 |
| 8,139,141 B2 * | 3/2012 | Bamji et al. | 348/348 |
| 2006/0124833 A1 * | 6/2006 | Toda | 250/214 R |
| 2007/0201859 A1 * | 8/2007 | Sarrat | 396/322 |
| 2008/0067330 A1 * | 3/2008 | Yamamoto | 250/226 |
| 2011/0001205 A1 * | 1/2011 | Sul et al. | 257/432 |
| 2011/0013055 A1 * | 1/2011 | Sul et al. | 348/273 |

FOREIGN PATENT DOCUMENTS

| | | |
|---|---|---|
| JP | 2008-058427 | 3/2008 |
| KR | 1020020017853 A | 3/2002 |

OTHER PUBLICATIONS

"Nanoimprint Lithography," Wikipedia, Mar. 13, 2009, <http://web.archive.org/web/20090313054608/http://en.wikipedia.org/wiki/Nanoimprint_lithography>.*

* cited by examiner

*Primary Examiner* — Andy Rao
(74) *Attorney, Agent, or Firm* — Myers Bigel Sibley & Sajovec PA

(57) ABSTRACT

Image sensors include three-dimensional (3D) color image sensors having an array of sensor pixels therein. A 3-D color image sensor may include a 3-D image sensor pixel having a plurality of color sensors and a depth sensor therein. The plurality of color sensors may include red, green and blue sensors extending adjacent the depth sensor. A rejection filter is also provided. This rejection filter, which extends opposite a light receiving surface of the 3-D image sensor pixel, is configured to be selectively transparent to visible and near-infrared light relative to far-infrared light. The depth sensor may also include an infrared filter that is selectively transparent to near-infrared light having wavelengths greater than about 700 nm relative to visible light.

20 Claims, 19 Drawing Sheets

US 8,581,964 B2

THREE-DIMENSIONAL IMAGE SENSORS AND METHODS OF MANUFACTURING THE SAME

REFERENCE TO PRIORITY APPLICATION

This application claims priority to Korean Patent Application No. 10-2009-0105800, filed Nov. 4, 2009, the contents of which are hereby incorporated herein by reference.

FIELD

The inventive concept relates generally to image sensors and, more particularly, to three-dimensional color image sensors.

BACKGROUND

A CMOS image sensor provides two-dimensional color image information, and a depth sensor provides three-dimensional information, or depth information. Since the depth sensor uses infrared light as a light source, the depth sensor provides only depth information and black-and-white image information, and cannot provide color image information.

Accordingly, a three-dimensional color image sensor is required, which can provide color image information and depth information within a single chip. To implement a three-dimensional color image sensor, a wavelength of light incident on a color sensor region should be different from a wavelength of light incident on a depth sensor region. That is, only visible light should be incident on the color sensor region, and only infrared light should be incident on the depth sensor region. However, it is complicated to allow different wavelength lights to enter corresponding regions within a single chip

SUMMARY

Image sensors according to embodiments of the invention include three-dimensional (3D) color image sensors having an array of sensor pixels therein. According to some of these embodiments of the invention, a 3D color image sensor includes a 3-D image sensor pixel having a plurality of color sensors and a depth sensor therein. The plurality of color sensors may include red, green and blue sensors extending adjacent the depth sensor. A rejection filter is also provided. This rejection filter, which extends opposite a light receiving surface of the 3-D image sensor pixel, is configured to be selectively transparent to visible and near-infrared light relative to far-infrared light.

According to additional embodiments of the invention, the depth sensor includes an infrared filter that is selectively transparent to near-infrared light having wavelengths greater than about 700 nm relative to visible light. This depth sensor may be surrounded on at least two sides by the plurality of color sensors. In addition, the infrared filter, which may include a photoresist material, may have a thickness in a range from about 800 nm to about 1200 nm. The infrared filter may also include a material selected from a group consisting of spin-on glass, an acrylic resin, a polymer resin and an epoxy resin in combination with at least one color dye and/or color pigment. The red, green and blue sensors may also include respective red, green and blue color filters that are coplanar with the infrared filter.

According to further embodiments of the invention, the rejection filter may include a composite of at least one inorganic material having a first refractive index and at least another inorganic material having a second refractive index different from the first refractive index. For example, the rejection filter may include a composite of at least one silicon dioxide layer and at least one titanium oxide layer. In particular, the rejection filter may include a plurality of silicon dioxide layers and a plurality of titanium oxide layers arranged in an alternating sequence.

BRIEF DESCRIPTION OF THE DRAWINGS

Example embodiments will be more clearly understood from the following detailed description taken in conjunction with the accompanying drawings.

DETAILED DESCRIPTION OF THE EMBODIMENTS

Figure 1:
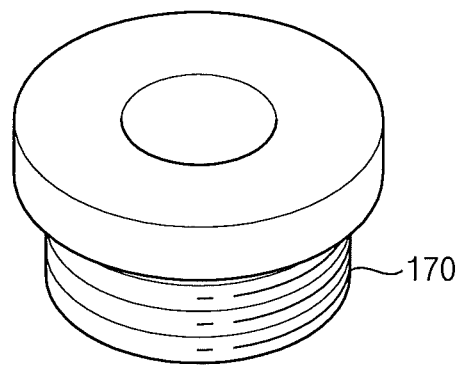
FIG. 1 is a diagram illustrating a three-dimensional color image sensor in accordance with a first embodiment of the present inventive concept.
Figure 1:
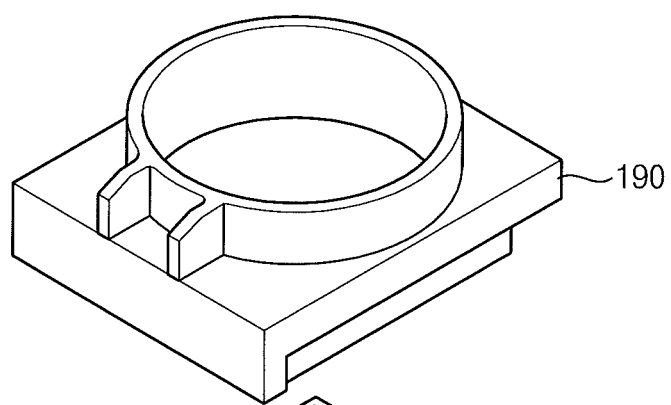
Figure 1:
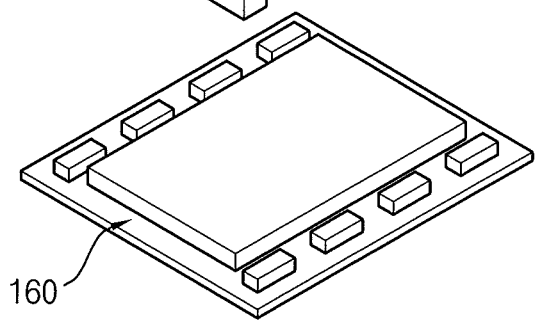

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

Figure 2:
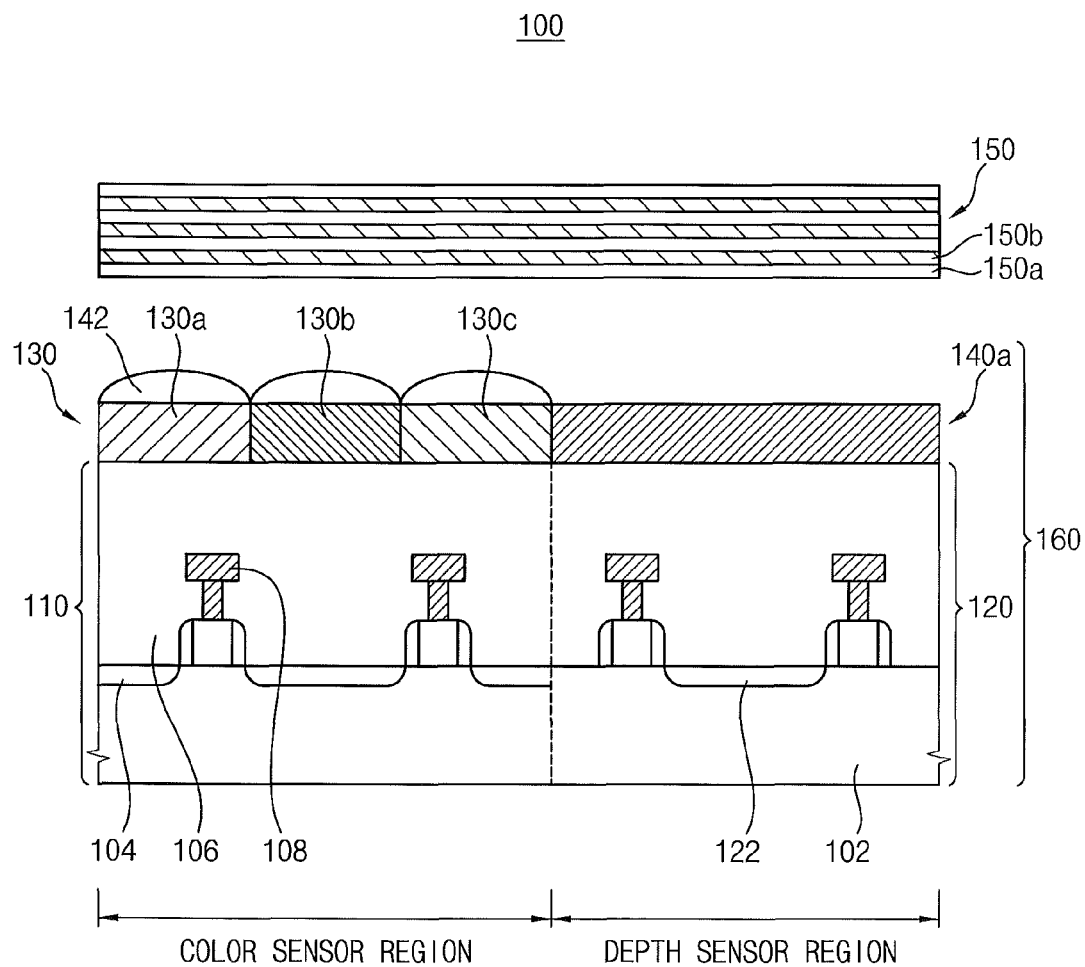
FIG. 2 is a cross-sectional view of a three-dimensional color image sensor illustrated in FIG. 1.
Figure 3:
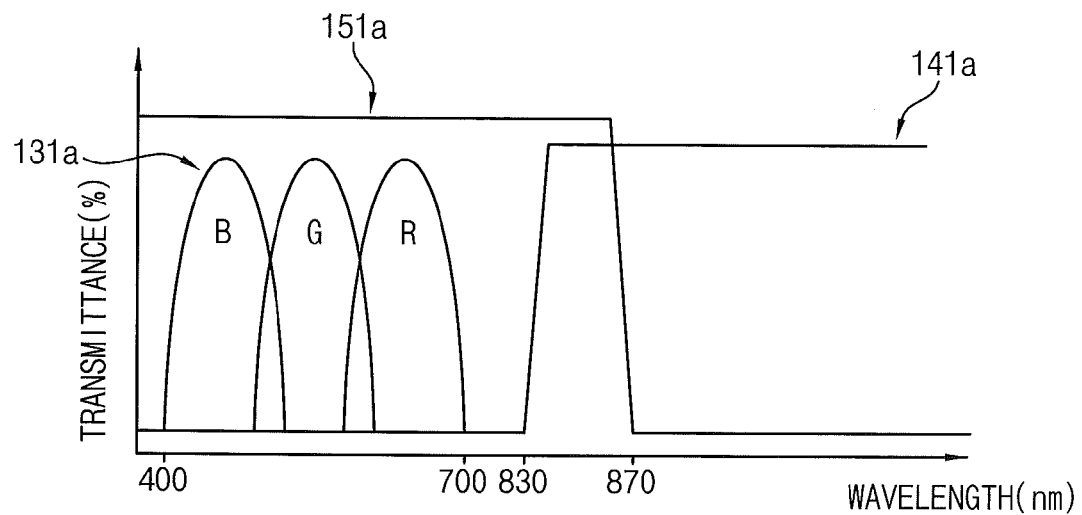
FIG. 3 is a graph illustrating transmittance of filters included in a three-dimensional color image sensor illustrated in FIG. 1.
Figure 4:
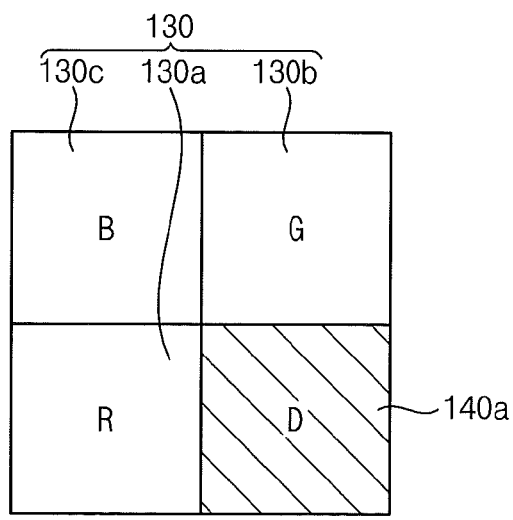
FIG. 4 is a diagram illustrating an arrangement of filters included in a three-dimensional color image sensor illustrated in FIG. 1.

FIG. 1 is a perspective view of a three-dimensional color image sensor in accordance with a first embodiment of the present inventive concept. FIG. 2 is a cross-sectional view of the three-dimensional color image sensor illustrated in FIG. 1. FIG. 3 is a graph illustrating transmittance of filters included in the three-dimensional color image sensor illustrated in FIG. 1. FIG. 4 is a diagram illustrating an arrangement of filters included in the three-dimensional color image sensor illustrated in FIG. 1.

Referring to FIGS. 1 and 2, a three-dimensional color image sensor 100 includes a rejection filter 150 and an image sensor 160 including color sensors 110 and depth sensors 120. The rejection filter 150 may be spaced apart from the image sensor 160. The image sensor 160 further includes filters 130 and 140a respectively formed on the color sensors 110 and the depth sensors 120.

Hereinafter, the image sensor 160 will be described in detail. The image sensor 160 is formed on a substrate 102 including a sensor region. The sensor region may include a color sensor region and a depth sensor region. The color sensor region and the depth sensor region may be disposed adjacent to each other. Although it is not illustrated, the substrate 102 may further include a logic region where logic circuits are formed.

In the first embodiment, the color sensors 110 may be formed on the color sensor region of the substrate 102. The color sensors 110 may convert incident light into an electrical signal. Each color sensor 110 may include a first photodiode 104 that generates photocharge in response to the incident light, a transfer transistor that transfers the photocharge from the first photodiode 104 to a floating diffusion region, a reset transistor that periodically resets the floating diffusion region, a drive transistor that serves as a source follower buffer amplifier and buffers a signal corresponding to the photocharge accumulated in the floating diffusion region, and a select transistor that selects a sensor as a switch. The first photodiode 104, the transfer transistor, the reset transistor, the drive transistor and the select transistor may be formed on the color sensor region of the substrate 102. Further, conductive lines 108 may be formed on the color sensor region of the substrate 102 to electrically connect the transistors, and a dielectric layer 106 covering the transistors may be formed on the color sensor region of the substrate 102.

The depth sensors 120 may be formed on the depth sensor region of the substrate 102. The depth sensors 120 may convert incident near-infrared light into an electrical signal. The near-infrared light may have a wavelength ranging from about 800 nm to about 900 nm. For example, the depth sensors 120 may use near-infrared light having a wavelength ranging from about 830 nm to about 870 nm as a light source.

Each depth sensor 120 may include a second photodiode 122 that generates photocharge in response to the near-infrared light, and transistors that transfer charges generated in the second photodiode 122 and amplify a signal corresponding to the charges. Conductive lines may be formed on the depth sensor region of the substrate 102 to electrically connect the transistors, and a dielectric layer 106 covering the transistors may be formed on the depth sensor region of the substrate 102.

An upper surface of the dielectric layer 106 formed on the color sensor region and the depth sensor region may be substantially flat. Although it is not illustrated, a thickness of the dielectric layer 106 formed on the color sensor region may be substantially the same as or different from a thickness of the dielectric layer 106 formed on the depth sensor region. To increase the intensity of light incident on the first and second photodiodes 104 and 122, the dielectric layer 106 may have a high light transmittance.

A first filter 140a is formed on the depth sensors 120. The first filter 140a may selectively transmit light having a wavelength longer than the upper limit of a visible light wavelength. The visible light wavelength ranges from about 400 nm to about 700 nm, and thus the first filter 140a may transmit light having a wavelength longer than about 700 nm. The first filter 140a may be disposed on the upper surface of the dielectric layer 106 of the depth sensors 120. The first filter 140a may have a long wave pass pattern disposed corresponding to the depth sensors 120. The long wave pass pattern may be thin enough to be applied to an image sensor. For example, a thickness of the long wave pass pattern may range from about 800 nm to about 1,200 nm. In the first embodiment, the long wave pass pattern may include a photoresist material where at least two of a blue pigment, a green pigment, a red pigment, a violet pigment and a yellow pigment are mixed. The transmittance of the first filter 140a may be determined according to colors, amounts, and ratio of the color pigments included in the long wave pass pattern. The composition of the photoresist material will be described in detail below.

A second filter 130 is formed on the color sensors 110. The second filter 130 may selectively transmit visible light having a wavelength ranging from about 400 nm to about 700 nm. The second filter 130 may be disposed on the upper surface of the dielectric layer 106 of the color sensors 110. The second filter 130 may be disposed corresponding to the color sensors 110 to provide a color image. For example, the second filter 130 may include a red pattern 130a, a green pattern 130b and a blue pattern 130c. As illustrated in FIG. 4, the first filter 140a and the second filter 130 may be disposed within each active pixel region of the image sensor 160. The first filter 140a and the second filter 130 may be disposed adjacent to each other. The array of the first filter 140a and the second filter 130 illustrated in FIG. 4 may be repetitively disposed throughout the image sensor 160. A microlens 142 is formed on the second filter 130. The microlens 142 may concentrate the incident light on the first photodiode 104.

As described above, the image sensor 160 included in the three-dimensional color image sensor 100 according to the first embodiment may include color sensors 110 for providing a color image and depth sensors 120 for providing depth information, which are integrated within a single chip.

Referring still to FIG. 2, rejection filter 150 may be formed over the image sensor 160. To allow the visible light and the near-infrared light to enter the color sensors 110 and the depth sensors 120, the rejection filter 150 may block a portion of the incident light. In the first embodiment, the rejection filter 150 may transmit light having a wavelength longer than the lower limit of the visible light wavelength and shorter than the upper limit of the near-infrared light wavelength. For example, the rejection filter 150 may transmit light having a wavelength ranging from about 400 nm to about 900 nm. The rejection filter 150 may have a stacked structure where inorganic compounds having different refractive indexes are alternately formed. For example, a silicon oxide layer 150a and a titanium oxide layer 150b may be alternately formed in the rejection filter 150. The transmittance of the rejection filter 150 may be determined according to thicknesses of the silicon oxide layer 150a and the titanium oxide layer 150b. Accordingly, the rejection filter 150 may be adjusted to transmit light of desired wavelengths.

As illustrated in FIG. 1, the three-dimensional color image sensor 100 may further include a lens module 170 disposed over the rejection filter 150. The lens module 170 may have lenses for concentrating light on the image sensor 160. The rejection filter 150 and the lens module 170 may be mounted in a mounting module 190 and may be spaced apart from the image sensor 160.

As described above, in the first embodiment, filter structures having different configurations are disposed on the color sensors 110 and the depth sensors 120, respectively. Hereinafter, a wavelength of light incident on each sensor will be described with reference to FIG. 3.

In FIG. 3, 151a represents a spectral transmittance of the rejection filter 150, 141a represents a spectral transmittance of the first filter 140a, and 131a represents a spectral transmittance of the second filter 130. A first filter structure including the first filter 140a and the rejection filter 150 is disposed on the depth sensors 120. As illustrated in FIG. 3, light having a wavelength ranging from about 400 nm to about 900 nm may be transmitted by the rejection filter 150, and then the transmitted light may be again filtered by the first filter 140a. Accordingly, the near-infrared light having a wavelength ranging from about 700 nm to about 900 nm may be transmitted by the first filter 140a, and may enter the depth sensors 120. A second filter structure including the second filter 130 and the rejection filter 150 is disposed on the color sensors 110. As illustrated in FIG. 3, light having a wavelength ranging from about 400 nm to about 900 nm may be transmitted by the rejection filter 150, and then the transmitted light may be again filtered by the second filter 130. Accordingly, the visible light having a wavelength ranging from about 400 nm to about 700 nm may be transmitted by the second filter 130, and may enter the color sensors 110. Accordingly, by using the first and second filter structures, lights of different wavelengths may enter corresponding regions. Further, by using the first and second filter structures, the three-dimensional color image sensor providing the three-dimensional color image may be implemented with a single chip.

Figure 5:
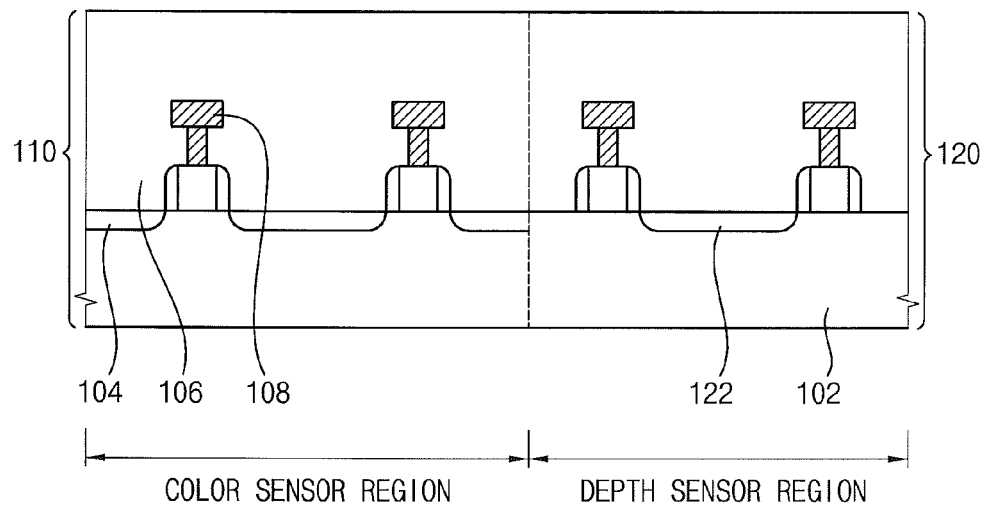
FIGS. 5 through 9 are cross-sectional views for illustrating a method of manufacturing a three-dimensional color image sensor illustrated in FIG. 2.

FIGS. 5 through 9 are cross-sectional views for illustrating a method of manufacturing a three-dimensional color image sensor illustrated in FIG. 2. Referring to FIG. 5, a substrate 102 including active pixel regions is provided. A color sensor region and a depth sensor region may be mixed in each active pixel region, and may be disposed adjacent to each other. Color sensors 110 are formed on the color sensor region of the substrate 102. For example, a first photodiode 104 may be formed and doped with impurities in the color sensor region of the substrate 102. A transfer transistor, a reset transistor, a drive transistor and a select transistor (not shown) are formed on the substrate 102. A dielectric layer 106 covering the first photodiode 104, the transfer transistor, the reset transistor, the drive transistor and the select transistor is formed, and conductive lines 108 electrically connecting the transistors are formed in the dielectric layer 106.

Depth sensors 120 are formed on the depth sensor region of the substrate 102. For example, a second photodiode 102 may be formed to generate photocharge in response to near-infrared light, and transistors (not shown) may be formed to transfer charges generated in the second photodiode 122 and to amplify a signal corresponding to the charges. The dielectric layer 106 covering the transistors is formed, and the conductive lines 108 electrically connecting the transistors are formed in the dielectric layer 106. Although not illustrated, logic circuits may be formed in a logic region of the substrate 102.

Thus, as illustrated by FIG. 5, the color sensors 110 are formed on the color sensor region of the substrate 102, and the depth sensors 120 are formed on the depth sensor region of the substrate 102. The color sensors 110 and the depth sensors 120 may be disposed adjacent to each other.

Figure 6:
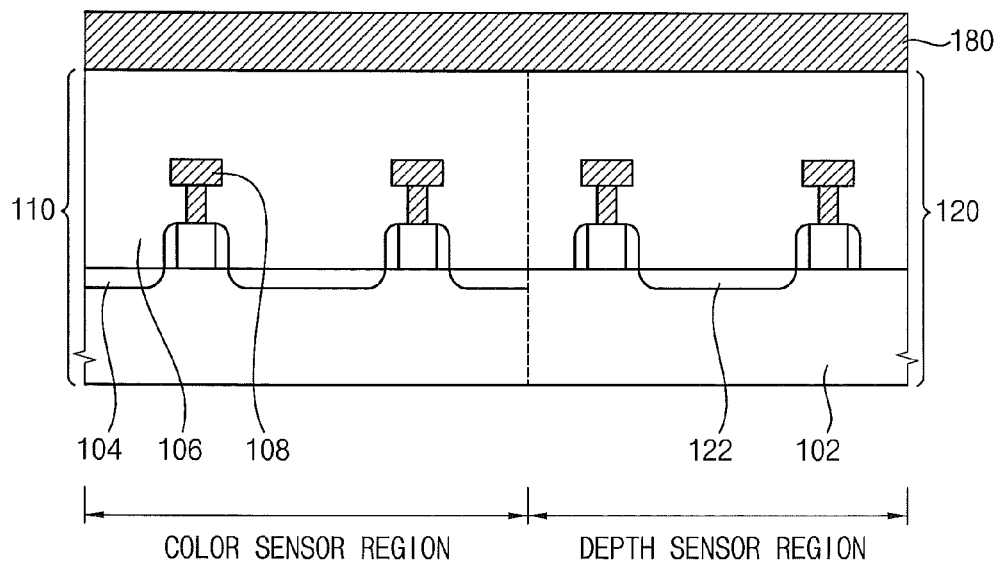

Referring to FIG. 6, a first photoresist layer 180 is coated on an upper surface of the dielectric layer 106 to form a first filter. The first filter may be a long wave pass filter that transmits light having a wavelength longer than that of visible light. Thus, the first photoresist layer 180 is required to a characteristic that selectively transmits the light having the wavelength longer than visible light wavelength. The first photoresist layer 180 may have a thickness ranging from about 800 nm to about 1,200 nm.

The first photoresist layer 180 may include a binder resin, a photopolymerizable compound, a photoinitiator, an additive, a solvent, and a pigment mixture including at least two of a blue pigment, a green pigment, a red pigment, a violet pigment and a yellow pigment. The additive may include a cross-linking agent, an adhesion accelerator, a dispersing agent, a surfactant, etc. The pigments included in the first photoresist layer 180 may be organic pigments. For example, the first photoresist layer 180 may include the binder resin of about 1 to 10 wt %, the photopolymerizable compound of about 1 to about 10 wt %, the photoinitiator of about 1 to about 10 wt %, the pigment mixture of about 3 to about 20 wt %, the additive of about 0.1 to about 5 wt %, and the solvent of about 45 to about 80 wt %. The binder resin may be dissolved in the solvent, may react with light or heat, and may serve as a bind agent for coloring. The binder resin may include an acrylic copolymer that may be dissolved in an alkaline developing solution. The acrylic copolymer may include a monomer having a hydrophobic radical. The photopolymerizable compound may be a compound that may be polymerized by light and the photoinitiator. The photopolymerizable compound may include a monofunctional monomer, a difunctional monomer, a multifunctional monomer, to name but a few. The photoinitiator may include at least one of acetophenone family compounds. The photoinitiator may be used with a photo-activated radical generating agent, a photosensitizer, etc. The solvent may include, but is not limited to, various types of organic solvents which are used for colored photosensitive resin compositions.

Each pigment included in the pigment mixture may be processed, for example, by a surface treatment using a pigment derivative where an acidic group or a basic group is introduced, a graft treatment for a surface of the pigment by a polymer compound, a refinement treatment, a washing treatment by organic solvent and water to eliminate impurities, an eliminating treatment by ion exchange to eliminate ionic impurities, etc.

The first photoresist layer 180 including the pigment mixture may have a high transmittance for light having a wavelength longer than about 800 nm, and may have a low transmittance for visible light. For example, the first photoresist layer 180 may have a transmittance more than about 80% for the light having the wavelength longer than about 800 nm, and may have a transmittance of about 20% for the visible light. The transmittance of the first photoresist layer 180 may be determined according to colors, amounts, and ratio of the pigments included in the first photoresist layer 180. Thus, the transmittance of the first photoresist layer 180 may be finely adjusted by changing the composition of the pigment mixture. For example, the first photoresist layer 180 may include the pigment mixture where the red pigment, the green pigment and the blue pigment are mixed with a ratio of 1:1:1. Alternatively, the ratio of the red pigment to the green pigment to the blue pigment may be changed. In another example, the first photoresist layer 180 may include the pigment mixture where the red pigment and the green pigment mixed with a ratio of 1:1.

Figure 7:
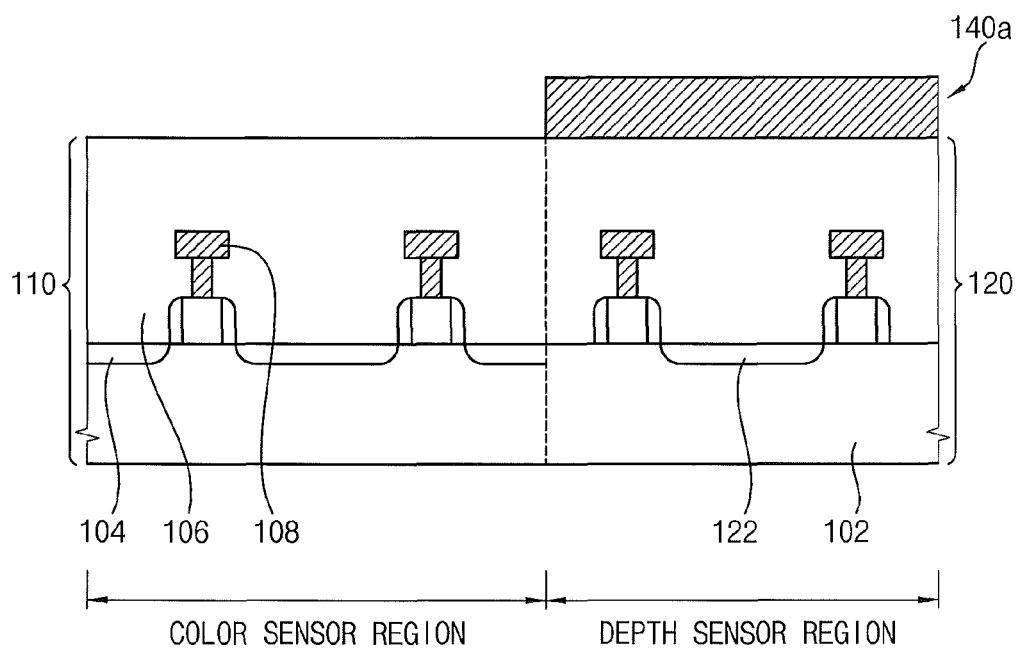

Referring to FIG. 7, an exposure and development process may be performed to remove the first photoresist layer 180 except for a region corresponding to the depth sensors 120. Accordingly, a first filter 140a having a long wave pass pattern may be formed in the region corresponding to the depth sensors 120. The first filter 140a may be hardened by a curing process. The long wave pass pattern included in the first filter 140a may have a thickness ranging from about 800 nm to about 1,200 nm.

Figure 8:
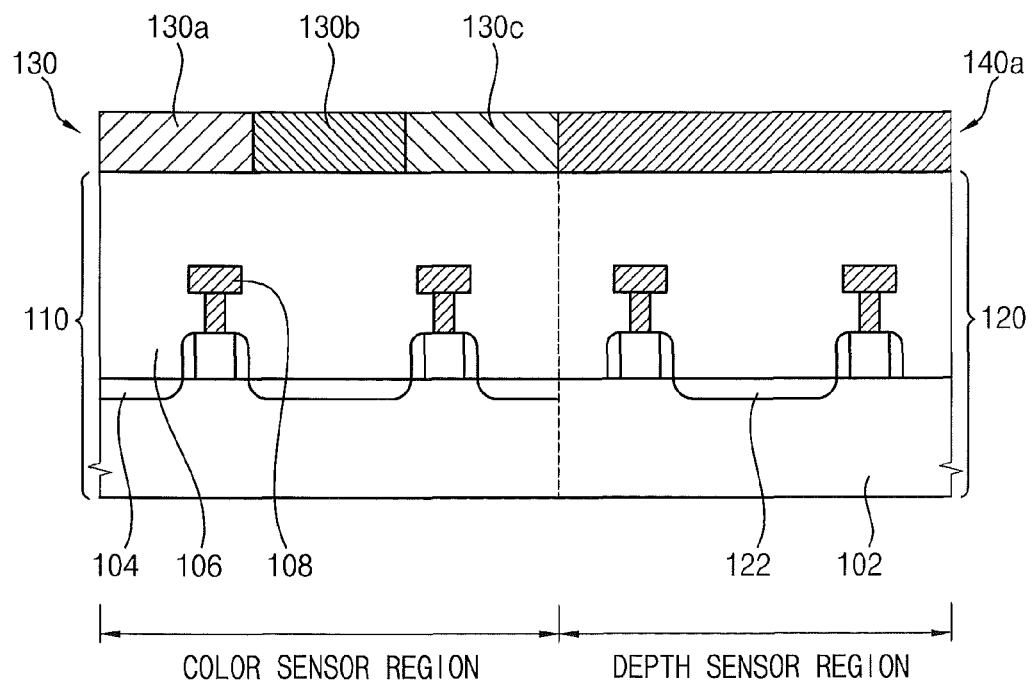

Referring to FIG. 8, a second filter 130 may be formed on a region of the upper surface of the dielectric layer 106 corresponding to the color sensors 110. The second filter 130 may be a color filter including a red pattern 130a, a green pattern 130b and a blue pattern 130c. To form the second filter 130, a second photoresist layer including a red pigment may be coated on the dielectric layer 106. A photolithography process may be performed to remove the second photoresist layer except for a region corresponding to red sensors of the color sensors 110. Accordingly, the red pattern 130a for transmitting light in a red wavelength band may be formed. A third photoresist layer including a green pigment may be coated on the dielectric layer 106. A photolithography process may be performed to remove the third photoresist layer except for a region corresponding to green sensors of the color sensors 110. Accordingly, the green pattern 130b for transmitting light in a green wavelength band may be formed. A fourth photoresist layer including a blue pigment may be coated on the dielectric layer 106. A photolithography process may be performed to remove the fourth photoresist layer except for a region corresponding to blue sensors of the color sensors 110. Accordingly, the blue pattern 130c for transmitting light in a blue wavelength band may be formed.

By such a manner, the second filter 130 may be formed including the red pattern 130a, the green pattern 130b and the blue pattern 130c. The order of forming the red pattern 130a, the green pattern 130b and the blue pattern 130c may be varied. Further, the order of forming the first filter 140a and the second filter 130 may be varied. For example, the first filter 140a may be formed after the second filter 130 is formed.

Figure 9:
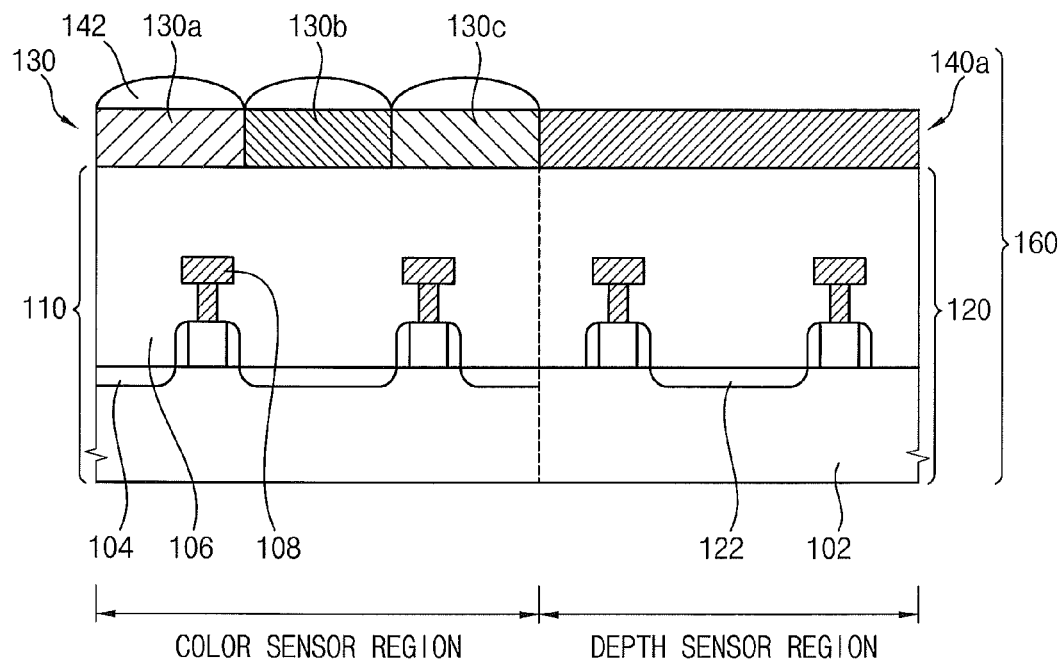

Referring to FIG. 9, a microlens 142 is formed on the second filter 130. The microlens 142 may include a photoresist material. For example, a photoresist layer may be coated on the first and second filters 140a and 130, and a lens pattern may be formed on the second filter 130 by an exposure and development process. After that, the microlens 142 having a convex surface may be formed by reflowing the lens pattern using a heat treatment at a temperature of about 200° C. Accordingly, the image sensor 160 may be formed including the color sensors 110 and the depth sensors 120.

Referring again to FIG. 2, a rejection filter 150 may be formed independently of the image sensor 160. The rejection filter 150 may transmit light having a wavelength ranging from about 400 nm to about 900 nm. The rejection filter 150 may be formed by alternately stacking layers having different refractive indexes. For example, a silicon oxide layer 150a and a titanium oxide layer 150b may be alternately stacked with different thicknesses to form the rejection filter 150. The refractive indexes, extinction coefficients and/or the thicknesses of the stacked layers may be adjusted to transmit light of desired wavelengths. For example, a spectra simulation system may be used to determine the thickness of each stacked layer included in the rejection filter 150. The rejection filter 150 may be mounted corresponding to the first and second filters 140a and 130. A lens module 170 may be mounted corresponding to the rejection filter 150. The rejection filter 150 and the lens module 170 may be mounted by a mounting module 180.

Hereinafter, spectrum characteristics of filters included in a three-dimensional color image sensor according to a first embodiment will be described below. In particular, spectrum characteristics of a rejection filter and a first filter will be described below.

Sample 1

A photoresist layer of a first sample, which is used for a first filter included in a three-dimensional color image sensor, may be manufactured by the method described above in accordance with the first embodiment of the present inventive concept.

A glass substrate for test may be provided, and a photoresist may be formed including a pigment mixture where a red pigment, a green pigment and a blue pigment are mixed with a ratio of 1:1:1. The photoresist may be formed by stirring a first photoresist of about 5 g for a red filter, a second photoresist of about 5 g for a green filter and a third photoresist of about 5 g for a blue filter during about 30 minutes. The first through third photoresists may be 600 series products manufactured by Fuji. The photoresist layer having a thickness of about 990 nm may be manufactured by coating and baking the formed photoresist.

Spectrum Characteristic Measurement

Figure 10:
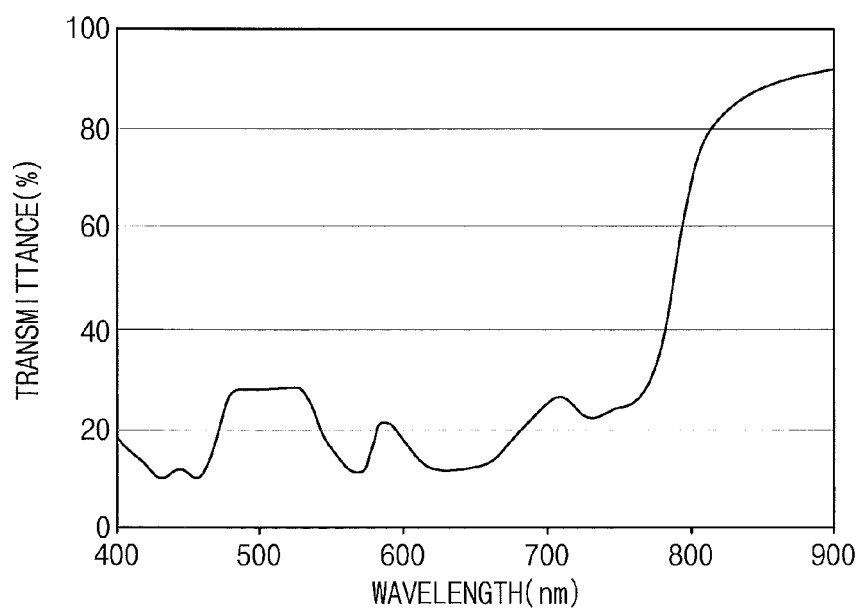
FIG. 10 is a graph illustrating a spectrum characteristic of a first filter of a first sample.

FIG. 10 illustrates the spectrum characteristic of the photoresist layer of the first sample. Referring to FIG. 10, the photoresist layer of the first sample may have a transmittance more than about 90% for light having a wavelength longer than about 850 nm, and may have a transmittance of about 28% for light having a wavelength of about 700 nm. An average transmittance of the photoresist layer may be about 16% for light having a wavelength shorter than about 700 nm. Thus, the photoresist layer of the first sample may be applicable to the first filter included in the three-dimensional color image sensor according to the first embodiment.

Sample 2

A rejection filter included in a three-dimensional color image sensor may be manufactured by the method described above in accordance with the first embodiment of the present inventive concept. The rejection filter may be formed by alternately stacking a silicon oxide layer and a titanium oxide layer. The thicknesses of the stacked silicon oxide layer and titanium oxide layer are described in table 1. The rejection filter may have a thickness of about 1930 nm.

TABLE 1

| Layer | Material | Thickness (um) |
|---|---|---|
| 1 | SiO2 | 72 |
| 2 | TiO2 | 20 |
| 3 | SiO2 | 5 |
| 4 | TiO2 | 69 |
| 5 | SiO2 | 24 |
| 6 | TiO2 | 13 |
| 7 | SiO2 | 132 |
| 8 | TiO2 | 9 |
| 9 | SiO2 | 27 |
| 10 | TiO2 | 65 |
| 11 | SiO2 | 10 |
| 12 | TiO2 | 23 |
| 13 | SiO2 | 156 |
| 14 | TiO2 | 13 |
| 15 | SiO2 | 16 |
| 16 | TiO2 | 74 |
| 17 | SiO2 | 17 |
| 18 | TiO2 | 19 |
| 19 | SiO2 | 164 |
| 20 | TiO2 | 88 |
| 21 | SiO2 | 14 |
| 22 | TiO2 | 16 |
| 23 | SiO2 | 159 |
| 24 | TiO2 | 19 |
| 25 | SiO2 | 5 |
| 26 | TiO2 | 75 |
| 27 | SiO2 | 23 |
| 28 | TiO2 | 8 |
| 29 | SiO2 | 154 |
| 30 | TiO2 | 19 |
| 31 | SiO2 | 19 |

Spectrum Characteristic Measurement

Figure 11:
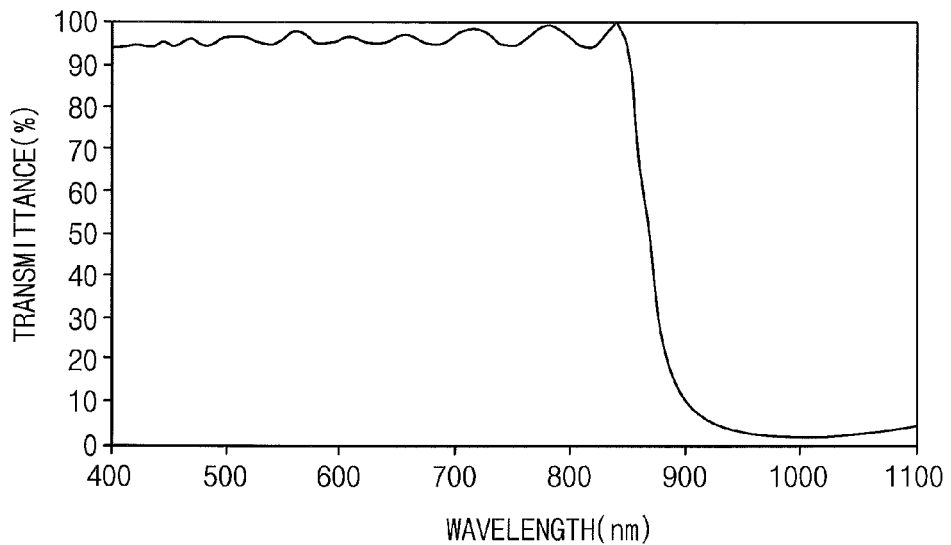
FIG. 11 is a graph illustrating a spectrum characteristic of a rejection filter of a second sample.

FIG. 11 illustrates the spectrum characteristic of the rejection filter of the second sample. Referring to FIG. 11, the rejection filter of the second sample may have a transmittance more than about 90% for light having a wavelength ranging from about 450 nm to about 850 nm, and may have a transmittance less than about 10% for light having a wavelength longer than about 900 nm. The rejection filter of the second sample may selectively transmit light having a wavelength longer than the lower limit of a visible light wavelength and shorter than the upper limit of a near-infrared light wavelength. Thus, the rejection filter of the second sample may be applicable to the rejection filter included in the three-dimensional color image sensor according to the first embodiment.

Embodiment 2

Figure 12:
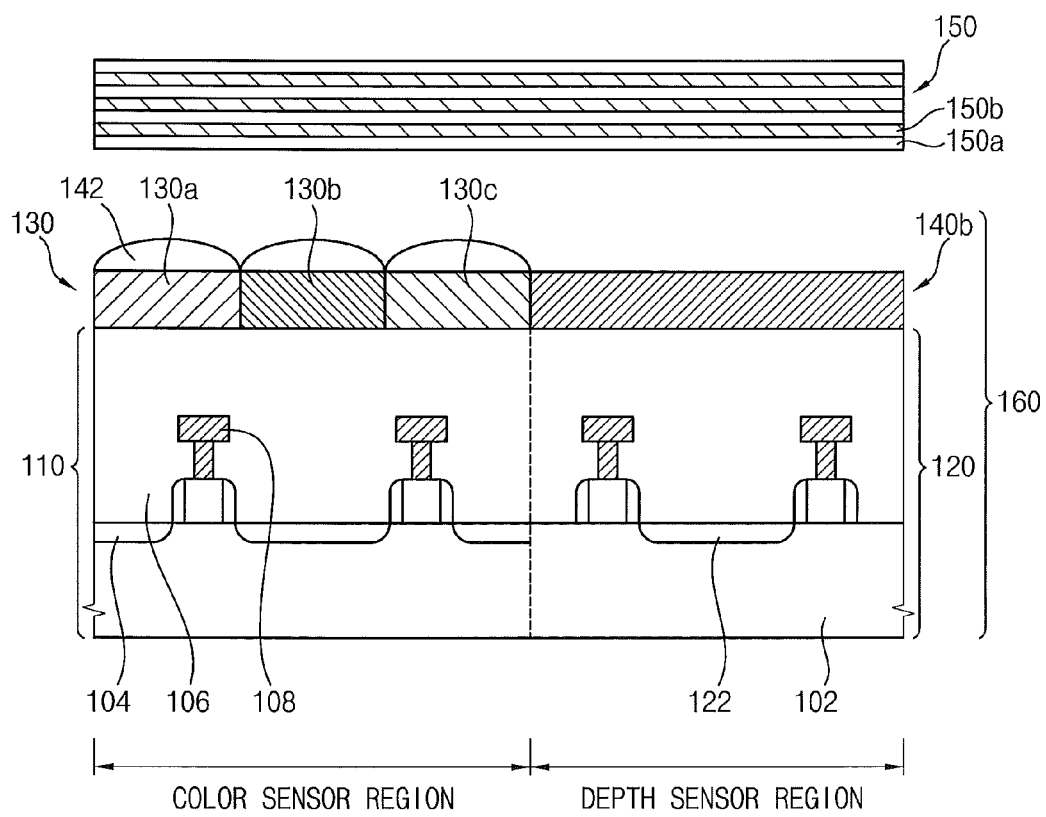
FIG. 12 is a cross-sectional view of a three-dimensional color image sensor in accordance with a second embodiment of the present inventive concept.

FIG. 12 is a cross-sectional view of a three-dimensional color image sensor in accordance with a second embodiment of the present inventive concept. As illustrated in FIG. 12, arrangements and configurations of a rejection filter 150, a first filter 140b and a second filter 130 included in a three-dimensional color image sensor according to a second embodiment may be substantially similar to those of the three-dimensional color image sensor according to the first embodiment. However, materials of a long wave pass pattern included in the first filter 140b according to the second embodiment may be different from those of the first filter 140a of the first embodiment.

In the second embodiment, the long wave pass pattern of the first filter 140b may include a photoresist material where at least two pigments of a blue pigment, a green pigment, a red pigment, a violet pigment and a yellow pigment and at least one dye of a blue dye, a green dye and a red dye are mixed. Examples of the composition of the photoresist material included in the long wave pass pattern will be described in detail below. Since the long wave pass pattern includes the at least one dye as well as the at least two pigments, a transmittance for visible light may decrease, and a transmittance for light having a wavelength longer than about 850 nm may increase. In particular, a transmittance for wavelength of about 700 nm may decrease.

Figure 13:
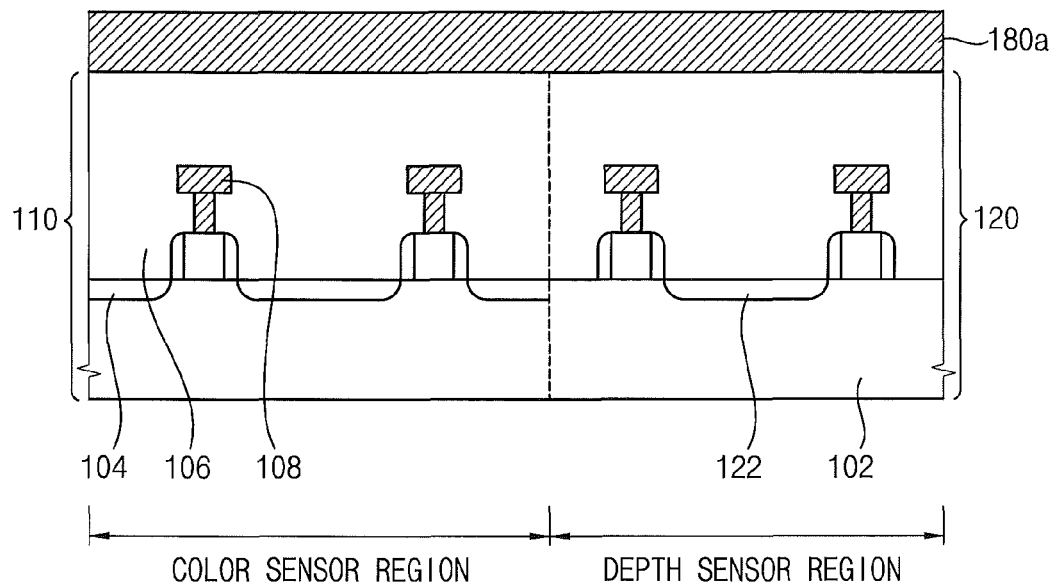
FIGS. 13 and 14 are cross-sectional views for illustrating a method of manufacturing a three-dimensional color image sensor illustrated in FIG. 12.
Figure 14:
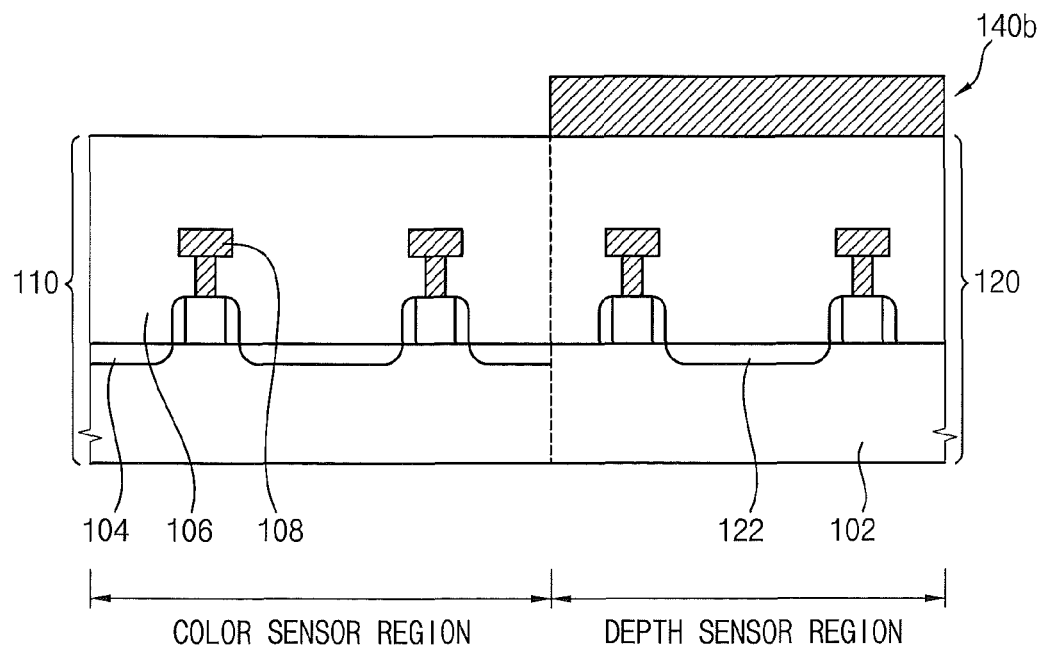

FIGS. 13 and 14 are cross-sectional views for illustrating a method of manufacturing a three-dimensional color image sensor illustrated in FIG. 12. The method of manufacturing the three-dimensional color image sensor according to the second embodiment may be substantially similar to that according to the first embodiment except for a method for forming the first filter 140b. As illustrated in FIG. 5, color sensors 110 are formed on a color sensor region of a substrate 102, and depth sensors 120 are formed on a depth sensor region of the substrate 102. The color sensors 110 and the depth sensors 120 may be disposed adjacent to each other.

Referring to FIG. 13, a first photoresist layer 180a is coated on an upper surface of a dielectric layer 106 to form a first filter. The first photoresist layer 180a may have a thickness ranging from about 800 nm to about 1,200 nm. The first photoresist layer 180a may include a binder resin, a photopolymerizable compound, a photoinitiator, an additive, a solvent, a pigment mixture including at least two of a blue pigment, a green pigment, a red pigment, a violet pigment and a yellow pigment, and at least of one of a red dye, a green dye and a blue dye. The additive may include a cross-linking agent, an adhesion accelerator, a dispersing agent, a surfactant, etc.

For example, the first photoresist layer 180a may include the binder resin of about 1 to 10 wt %, the photopolymerizable compound of about 1 to about 10 wt %, the photoinitiator of about 1 to about 10%, the pigment mixture and the dye of about 3 to about 20 wt %, the additive of about 0.1 to about 5 wt %, and the solvent of about 45 to about 80 wt %. The dye may include a disperse dye, an azo metal dye, a phthalocyanine dye, etc. If the disperse dye is used as the red dye, the dye may suffer photodecomposition during a subsequent exposure process, thereby changing the transmittance. However, if the azo metal dye is used the red dye, the transmittance may not be changed. Thus, the azo metal dye may be suitable for the red dye. The first photoresist layer 180a including the pigment mixture and the dye may have a high transmittance for light having a wavelength longer than about 800 nm, and may have a low transmittance for visible light. For example, the first photoresist layer 180a may have a transmittance more than about 80% for the light having the wavelength longer than about 800 nm, and may have a transmittance of about 10% for the visible light. Further, the first photoresist layer 180a may have an excellent patterning characteristic. For example, the first photoresist layer 180a may have a fine pattern having a line width less than about 20 μm by a subsequent exposure process.

The transmittance of the first photoresist layer 180a may be determined according to colors, amounts, and ratios of the pigments and the dye included in the first photoresist layer 180a. Thus, the transmittance of the first photoresist layer 180a may be finely adjusted by changing the composition of the pigment mixture and the dye. For example, the first photoresist layer 180a may include the pigment mixture where the red pigment, the green pigment and the blue pigment are mixed with a ratio of 1:1:1 and a dye mixture where the red dye and the blue dye are mixed with a ratio of 1:1. Alternatively, the first photoresist layer 180a may include the pigment mixture where two pigments of the red pigment, the green pigment and the blue pigment are mixed and one dye of which a color is different from colors of the two pigments.

Referring to FIG. 14, an exposure and development process may be performed to remove the first photoresist layer 180a except for a region corresponding to the depth sensors 120. Accordingly, a first filter 140b may be formed in the region corresponding to the depth sensors 120. The first filter 140b may be hardened by a curing process. By performing the processes described above with reference to FIGS. 8, 9 and 2, a second filter 130 is formed in an image sensor 160. A rejection filter 150 and a lens module may be mounted corresponding to the image sensor 160.

Sample 3

A photoresist layer of a third sample, which is used for a first filter included in a three-dimensional color image sensor, may be manufactured by the method described above in accordance with the second embodiment of the present inventive concept. A glass substrate for test may be provided, and a photoresist may be formed including a pigment mixture where a red pigment, a green pigment and a blue pigment are mixed with a ratio of 1:1:1 and a dye mixture where a blue dye and a red dye are mixed with a ratio of 1:1. The photoresist may be formed by stirring a first photoresist of about 5 g for a red filter, a second photoresist of about 5 g for a green filter, a third photoresist of about 5 g for a blue filter, an azo metal red dye of about 0.3 g, a phthalocyanine blue dye of about 0.3 g, a photoinitiator of about 1 g, and an adhesive of about 0.08 g dissolved in a solvent of about 2 ml during about 30 minutes. The first through third photoresists may be 600 series products manufactured by Fuji, the red dye may be a solvent red 160, and the blue dye may be a copper phthalocyanine tetrasulfonic acid tetrasodium salt. The photoresist layer having a thickness of about 1,112 nm may be manufactured by coating and baking the formed photoresist.

Spectrum Characteristic Measurement

Figure 15:
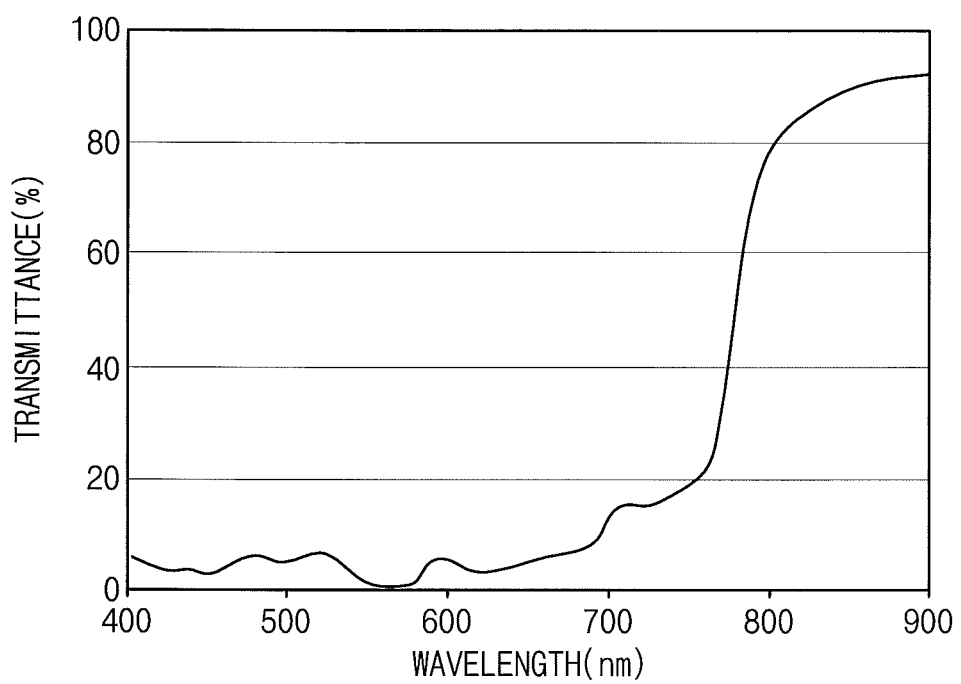
FIG. 15 is a graph illustrating a spectrum characteristic of a first filter of a third sample.

FIG. 15 illustrates the spectrum characteristic of the photoresist layer of the third sample. Referring to FIG. 15, the photoresist layer of the third sample may have a transmittance more than about 91% for light having a wavelength longer than about 850 nm, and may have a transmittance of about 21.8% for light having a wavelength of about 700 nm. An average transmittance of the photoresist layer may be about 6.4% for light having a wavelength shorter than about 700 nm. Thus, the photoresist layer of the third sample may be applicable to the first filter included in the three-dimensional color image sensor according to the second embodiment.

Sample 4

A photoresist layer of a fourth sample, which is used for a first filter included in a three-dimensional color image sensor, may be manufactured by the method used for manufacturing the photoresist layer of the third sample. However, the photoresist layer of the fourth sample may be thinner than the photoresist layer of the third sample. The photoresist layer of the fourth sample may have a thickness of about 816 nm.

Spectrum Characteristic Measurement

The photoresist layer of the fourth sample may have a transmittance more than about 91% for light having a wavelength longer than about 850 nm, and may have a transmittance of about 31.4% for light having a wavelength of about 700 nm. An average transmittance of the photoresist layer may be about 13.4% for light having a wavelength shorter than about 700 nm. Thus, the photoresist layer of the third sample may be more applicable to the first filter included in the three-dimensional color image sensor according to the second embodiment than the photoresist layer of the fourth sample.

Embodiment 3

Figure 16:
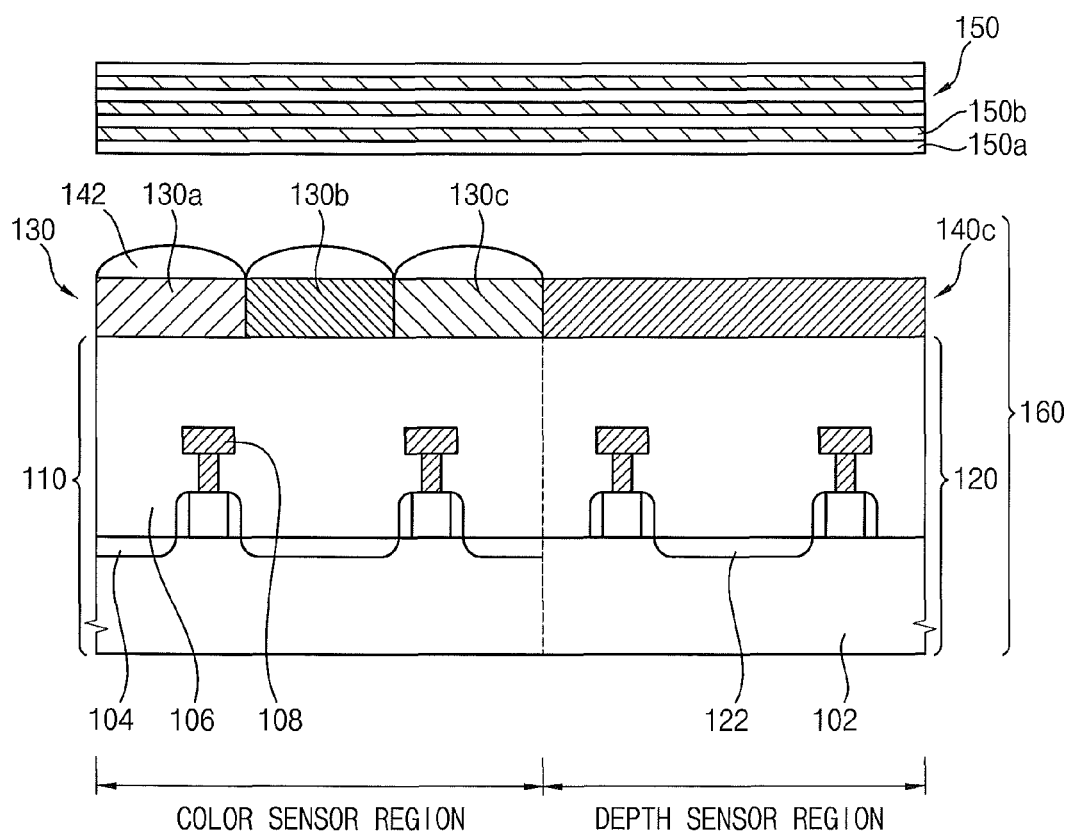
FIG. 16 is a cross-sectional view of a three-dimensional color image sensor in accordance with a third embodiment of the present inventive concept.

FIG. 16 is a cross-sectional view of a three-dimensional color image sensor in accordance with a third embodiment of the present inventive concept. As illustrated in FIG. 16, arrangements and configurations of a rejection filter 150, a first filter 140c and a second filter 130 included in a three-dimensional color image sensor according to a third embodiment may be substantially similar to those of the three-dimensional color image sensor according to the first embodiment. However, materials of a long wave pass pattern included in the first filter 140c according to the third embodiment may be different from those of the first embodiment.

In the third embodiment, the long wave pass pattern of the first filter 140c may include at least one of a spin on glass, an acrylic resin, a polymer resin and an epoxy resin, and at least one of color dyes and color pigments. For example, the long wave pass pattern of the first filter 140c may include at least one of the spin on glass, the acrylic resin, the polymer resin and the epoxy resin, and a dye mixture where at least two of a blue dye, a green dye and a red dye are mixed.

In another example, the long wave pass pattern of the first filter 140c may include at least one of the spin on glass, the acrylic resin, the polymer resin and the epoxy resin, and a pigment mixture where at least two of a blue pigment, a green pigment, a red pigment, a yellow pigment and a violet pigment are mixed.

In still another example, the long wave pass pattern of the first filter 140c may include at least one of the spin on glass, the acrylic resin, the polymer resin and the epoxy resin, the dye mixture where at least two of the blue dye, the green dye and the red dye are mixed, and at least one of the blue pigment, the green pigment, the red pigment, the yellow pigment and the violet pigment.

Figure 17:
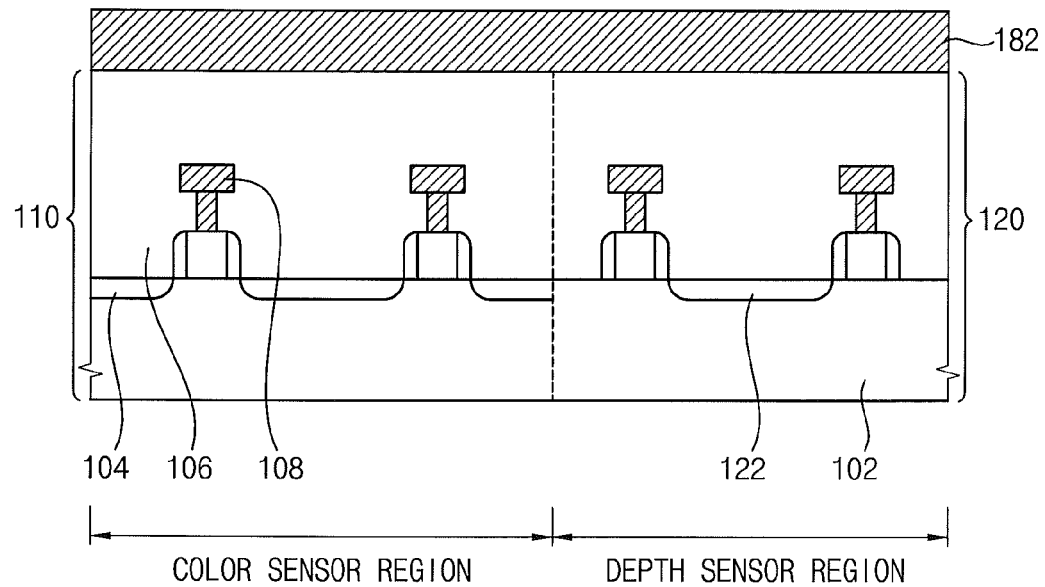
FIGS. 17 through 19 are cross-sectional views for illustrating a method of manufacturing a three-dimensional color image sensor illustrated in FIG. 16.
Figure 18:
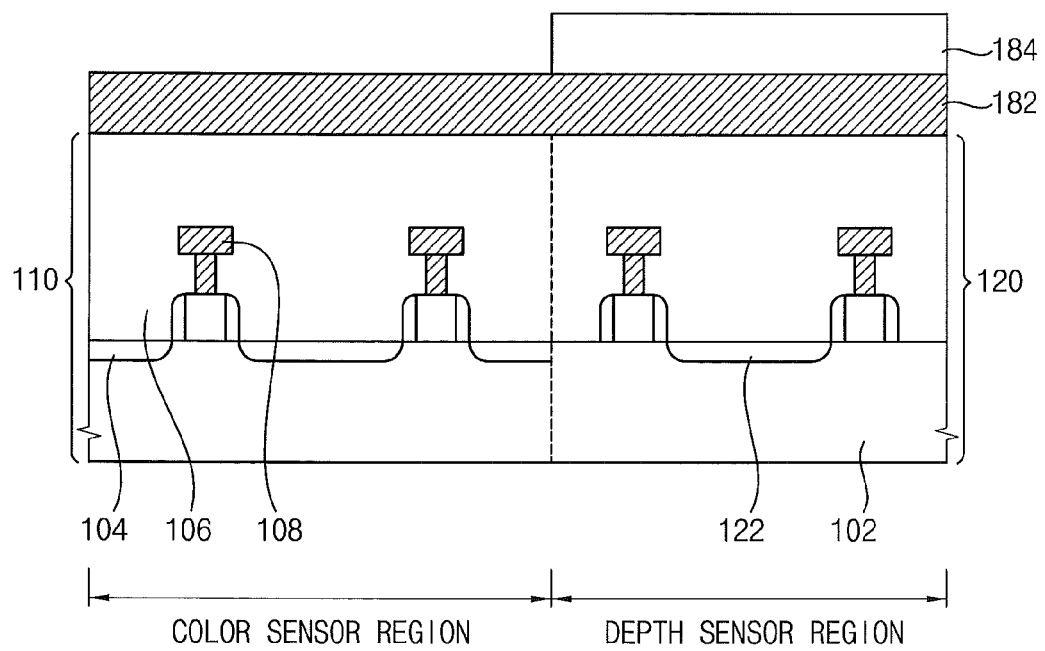
Figure 19:
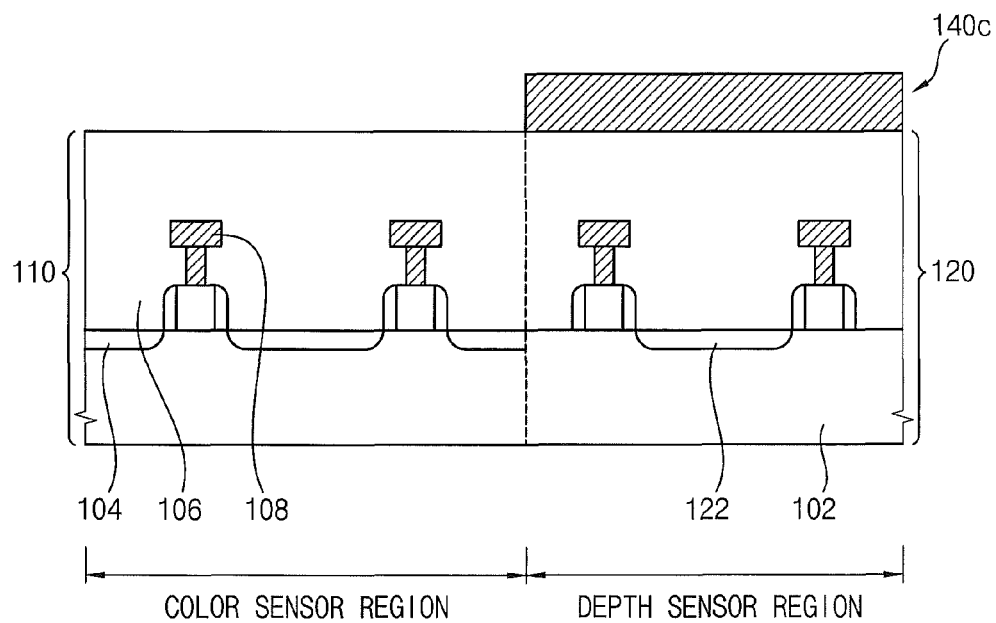

FIGS. 17 through 19 are cross-sectional views for illustrating a method of manufacturing a three-dimensional color image sensor illustrated in FIG. 16. The method of manufacturing the three-dimensional color image sensor according to the third embodiment may be substantially similar to that according to the first embodiment except for a method for forming the first filter 140c. Referring to FIG. 17, a filter layer 182 is formed on an upper surface of a dielectric layer 106 to form a first filter. The filter layer 182 may be formed by coating or taping. For example, the filter layer 182 may include a spin on glass, an acrylic resin, a polymer resin, an epoxy resin, etc. The filter layer 182 may further include at least one of color dyes and color pigments. For example, the filter layer 182 may include a dye mixture where at least two dyes of a red dye, a green dye and a blue dye. The dye may include a disperse dye, an azo metal dye, a phthalocyanine dye, etc. In another example, the filter layer 182 may include the dye mixture where at least two of the red dye, the green dye and the blue dye are mixed, and at least one pigment of a red pigment, a green pigment, a blue pigment, a yellow pigment and a violet pigment. In still another example, the filter layer 182 may include a pigment mixture where at least two of the red pigment, the green pigment, the blue pigment, the yellow pigment and the violet pigment are mixed.

In an example, the filter layer 182 may include the dye mixture where the red dye, the green dye and the blue dye are mixed with a ratio of 1:1:1. The filter layer 182 including the dye mixture may have a high transmittance more than about 80% for light having a wavelength longer than about 800 nm, and may have a low transmittance of about 10% for visible light. The transmittance of the filter layer 182 may be adjusted by changing amounts and ratios of the dye mixture and the pigment mixture.

Referring to FIG. 18, an etching mask pattern 184 is formed on the filter layer 182. The etching mask pattern 184 may be composed of a photoresist pattern formed by a photolithography process. The etching mask pattern 184 may cover a region corresponding to the depth sensors 120. The photolithography process for forming the etching mask pattern 184 may include coating, exposure, development and curing processes.

Referring to FIG. 19, the filter layer 182 exposed by the etching mask pattern 184 is etched. Accordingly, the first filter 140c may be formed on the region corresponding to the depth sensors 120. The etching mask pattern 184 may be removed. By performing the processes described above with reference to FIGS. 8, 9 and 2, a second filter 130 is formed in an image sensor 160. A rejection filter 150 and a lens module may be mounted corresponding to the image sensor 160.

Hereinafter, a spectrum characteristic of a first filter included in a three-dimensional color image sensor according to a third embodiment will be described below.

Sample 5

A filter layer of a fifth sample, which is used for a first filter included in a three-dimensional color image sensor, may be manufactured by the method described above in accordance with the third embodiment of the present inventive concept. A glass substrate for test may be provided. A material for a filter may include a polymethyl methacrylate (PMMA) polymer, a DR13 disperse red dye of about 5 g, a DY7 disperse yellow dye of about 12 g, and a blue dye of about 40 g. The filter layer of the fifth sample may be formed with a thickness of about 1,000 nm by coating and baking the material for the filter.

Spectrum Characteristic Measurement

The filter layer of the fifth sample may have a transmittance of more than about 88.5% for light having a wavelength longer than about 850 nm, and may have a transmittance of about 3.52% for light having a wavelength of about 700 nm. An average transmittance of the photoresist layer may be about 0.62% for light having a wavelength shorter than about 700 nm. Thus, the filter layer of the fifth sample may be applicable to the first filter included in the three-dimensional color image sensor according to the third embodiment.

Embodiment 4

Figure 20:
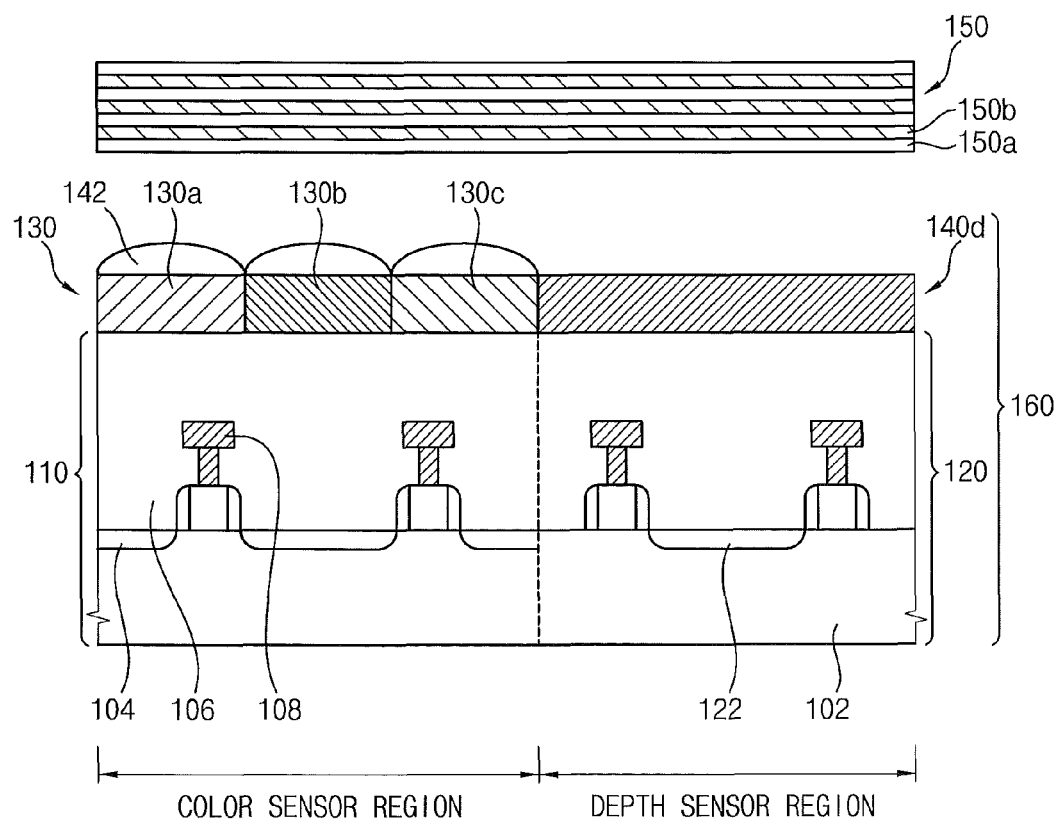
FIG. 20 is a cross-sectional view of a three-dimensional color image sensor in accordance with a fourth embodiment of the present inventive concept.

FIG. 20 is a cross-sectional view of a three-dimensional color image sensor in accordance with a fourth embodiment of the present inventive concept. As illustrated in FIG. 20, arrangements and configurations of a rejection filter 150, a first filter 140d and a second filter 130 included in a three-dimensional color image sensor according to a fourth embodiment may be substantially similar to those of the three-dimensional color image sensor according to the first embodiment. However, materials of a long wave pass pattern included in the first filter 140d according to the fourth embodiment may be different from those of the first embodiment.

In the fourth embodiment, the long wave pass pattern of the first filter 140d may include an imprinting resin and at least one of color dyes and color pigments. For example, the long wave pass pattern of the first filter 140d may include the imprinting resin and a dye mixture where at least two of a blue dye, a green dye and a red dye are mixed. In another example, the long wave pass pattern of the first filter 140d may include the imprinting resin and a pigment mixture where at least two of a blue pigment, a green pigment and a red pigment are mixed. In still another example, the long wave pass pattern of the first filter 140d may include the imprinting resin, the dye mixture where at least two of the blue dye, the green dye and the red dye are mixed, and at least one of the blue pigment, the green pigment and the red pigment.

Figure 21:
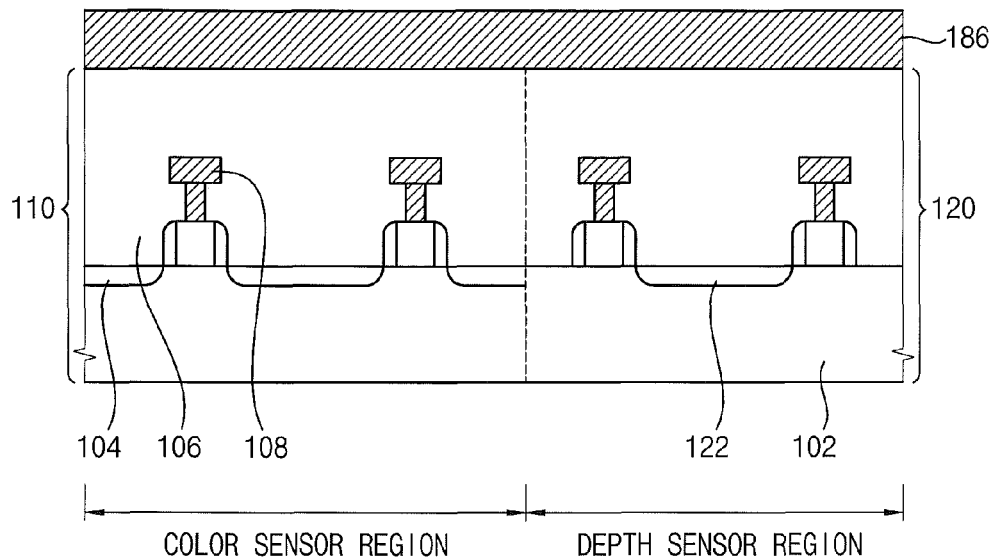
FIGS. 21 through 25 are cross-sectional views for illustrating a method of manufacturing a three-dimensional color image sensor illustrated in FIG. 20.

FIGS. 21 through 25 are cross-sectional views for illustrating a method of manufacturing a three-dimensional color image sensor illustrated in FIG. 20. The method of manufacturing the three-dimensional color image sensor according to the fourth embodiment may be substantially similar to that according to the first embodiment except for a method for forming the first filter 140d. Referring to FIG. 21, a filter layer 186 is formed on an upper surface of a dielectric layer 106 to form a first filter. The filter layer 186 including an imprinting resin may be formed by coating or taping. The filter layer 186 may further include at least one of color dyes and color pigments. For example, the filter layer 186 may include the imprinting resin and a dye mixture where at least two dyes of a red dye, a green dye and a blue dye. The filter layer 186 may further include at least one of pigment of a red pigment, a green pigment, a blue pigment, a yellow pigment and a violet pigment.

In another example, the filter layer 186 may include the imprinting resin and a pigment mixture where at least two of the red pigment, the green pigment, the blue pigment, the yellow pigment and the violet pigment are mixed.

In an example, the filter layer 186 may include the imprinting resin and the dye mixture where the red dye and the blue dye are mixed with a ratio of 1:1. The filter layer 186 including the dye mixture may have a high transmittance more than about 80% for light having a wavelength longer than about 800 nm, and may have a low transmittance of about 10% for visible light. The transmittance of the filter layer 186 may be adjusted by changing amounts and ratios of the dye mixture and the pigment mixture.

Figure 22:
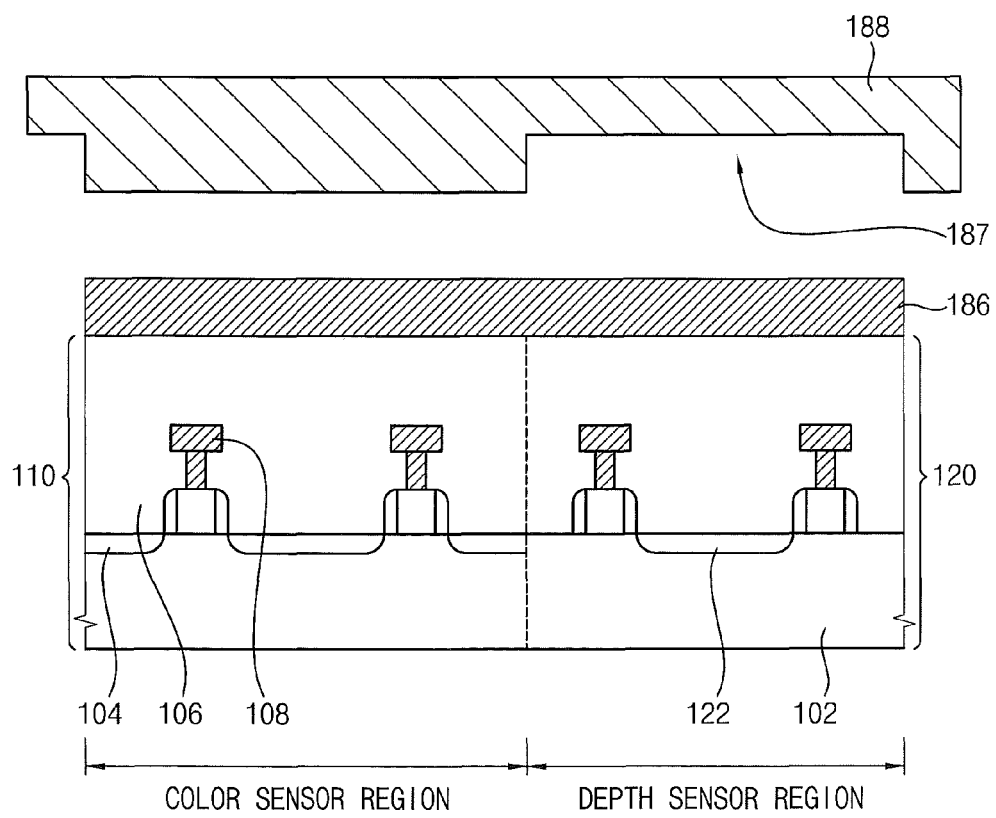
Figure 23:
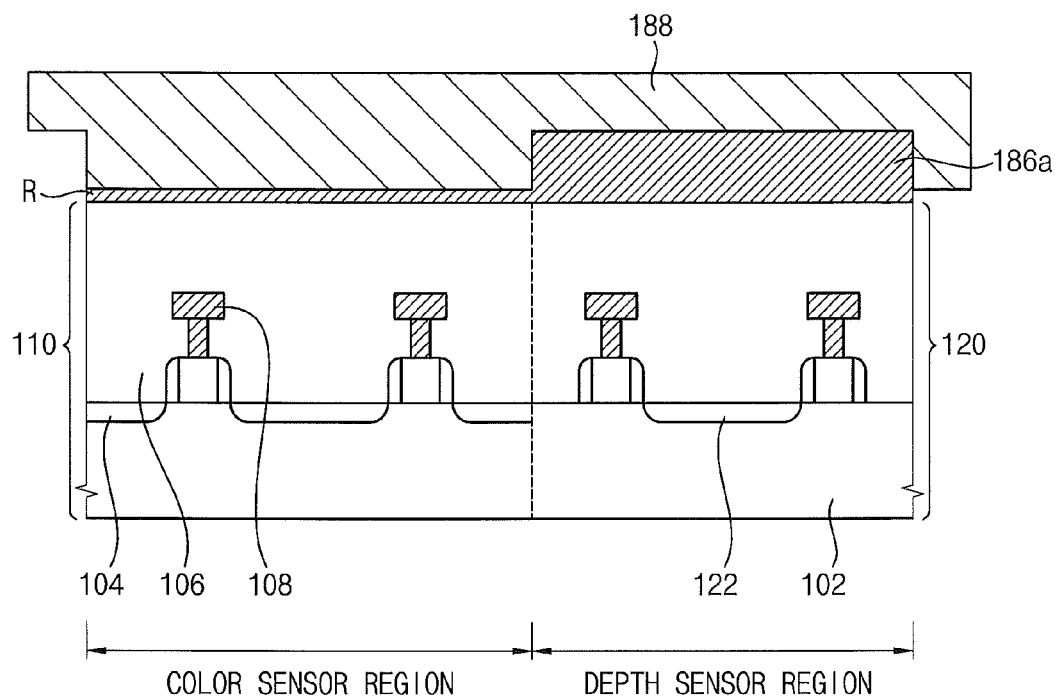

Referring to FIG. 22, a mold pattern 188 for imprinting is disposed on the filter layer 186. The mold pattern 188 may have a groove 187 corresponding to a depth sensor region. Referring to FIG. 23, the filter layer 186 and the mold pattern 188 are contacted and pressed together. If the filter layer 186 and the mold pattern 188 are contacted, a portion of the filter layer 186 may remain in the inside of the groove 187 of the mold pattern 188, and the filter layer 186 other than the portion in the inside of the groove 187 may be pushed out by the pressure and may be mostly removed.

Figure 24:
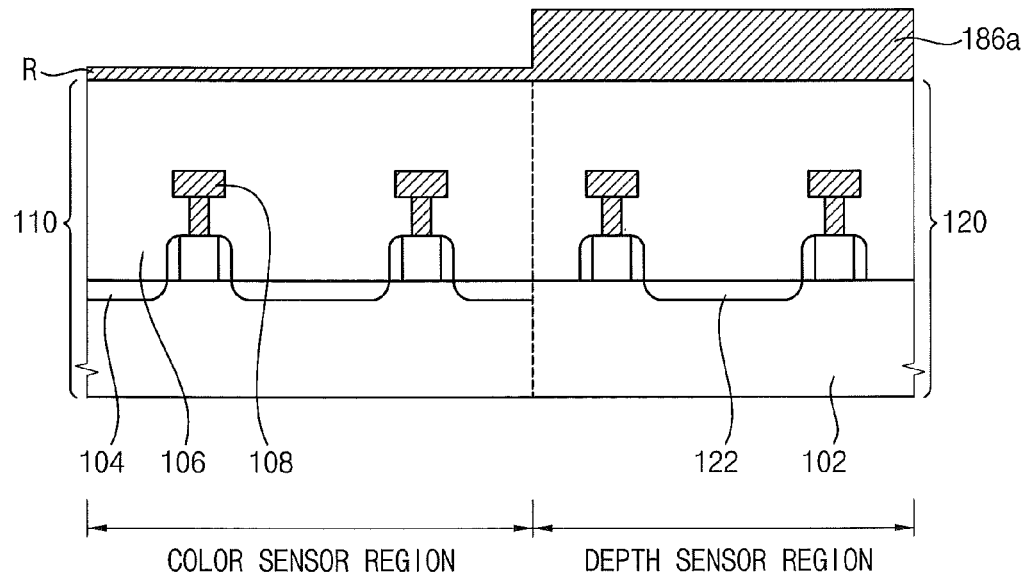

Referring to FIG. 24, the filter layer 186 and the mold pattern 188 are separated. If the mold pattern 188 is separated from the filter layer 186, a filter layer pattern 186a may be formed corresponding to the groove 187 of the mold pattern 188. The filter layer 186 outside the filter layer pattern 186a may be mostly removed, and some remaining filter layer R may remain outside the filter layer pattern 186a.

Figure 25:
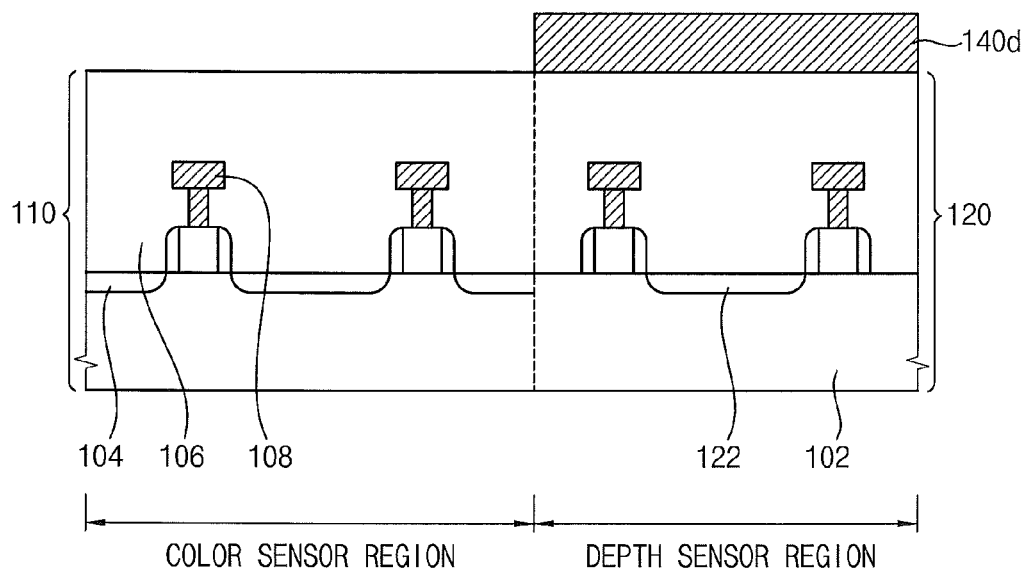

Referring to FIG. 25, the first filter 140d is formed by removing the remaining filter layer R outside the filter layer pattern 186a. The removal of the remaining filter layer R may be performed by an ashing process. By performing the processes described above with reference to FIGS. 8, 9 and 2, a second filter 130 is formed in an image sensor 160. A rejection filter 150 and a lens module may be mounted corresponding to the image sensor 160.

Embodiment 5

Figure 26:
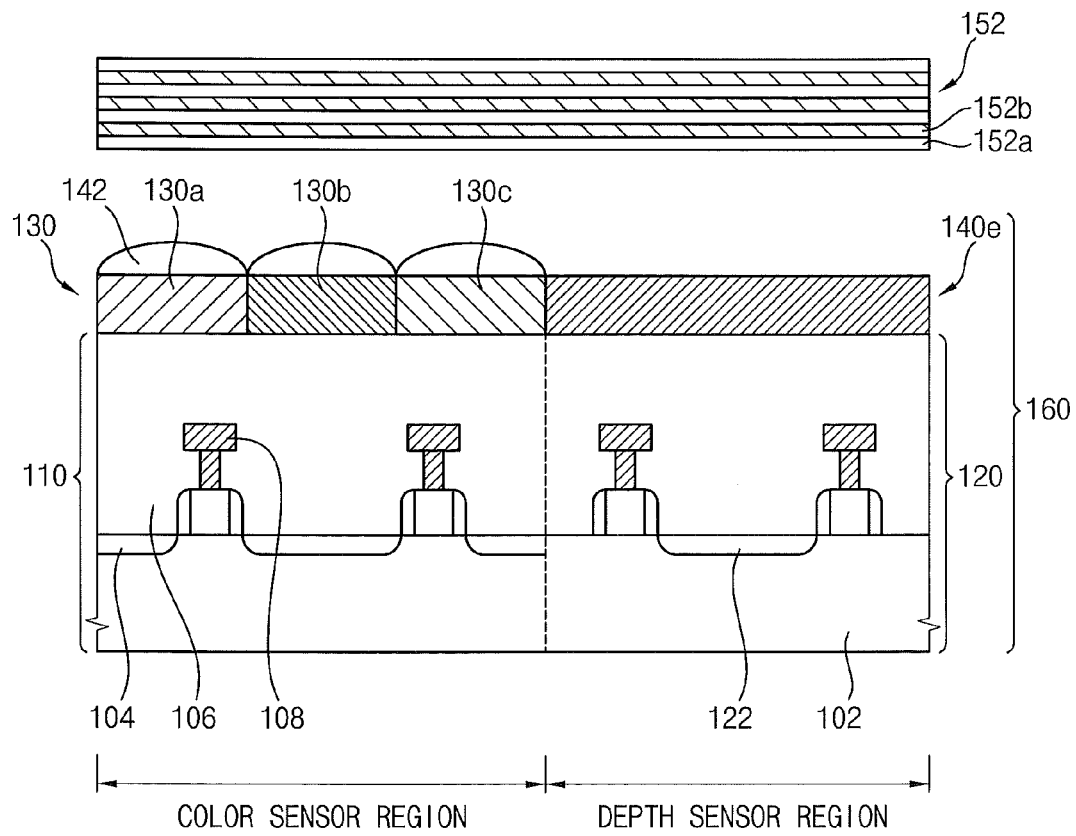
FIG. 26 is a cross-sectional view of a three-dimensional color image sensor in accordance with a fifth embodiment of the present inventive concept.

FIG. 26 is a cross-sectional view of a three-dimensional color image sensor in accordance with a fifth embodiment of the present inventive concept. As illustrated in FIG. 26, arrangements and configurations of a rejection filter 152, a first filter 140e and a second filter 130 included in a three-dimensional color image sensor according to a fifth embodiment may be substantially similar to those of the three-dimensional color image sensor according to the first embodiment. However, transmittances of the rejection filter 152 and the first filter 140e according to the fifth embodiment may be different from those of the first embodiment.

Materials included in the rejection filter 152 and the first filter 140e according to the fifth embodiment may be substantially the same as those of the first through fourth embodiments. However, amounts of the materials and thicknesses of layers included in the rejection filter 152 and the first filter 140e may be different from those of the first through fourth embodiments.

Figure 27:
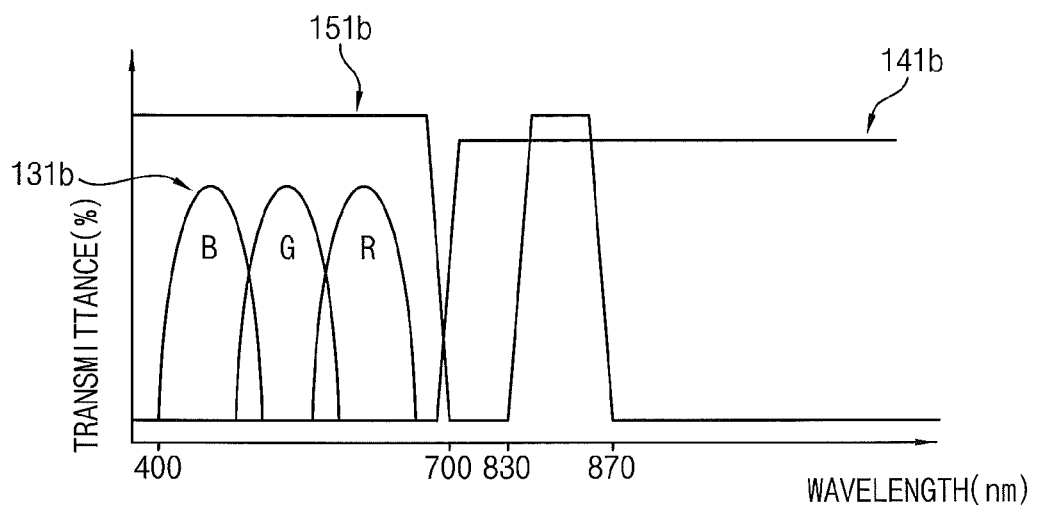
FIG. 27 is a graph illustrating transmittances of filters included in a three-dimensional color image sensor illustrated in FIG. 26.

FIG. 27 is a graph illustrating transmittances of filters included in a three-dimensional color image sensor illustrated in FIG. 26. In FIG. 27, 151b represents a spectral transmittance of the rejection filter 152, 141b represents a spectral transmittance of the first filter 140e, and 131b represents a spectral transmittance of the second filter 130. As illustrated in FIG. 27, the rejection filter 152 may transmit only visible light and near-infrared light. For example, the rejection filter 152 may transmit light having a wavelength ranging from about 400 nm to about 700 nm and from about 800 nm to about 900 nm.

Referring to FIGS. 26 and 27, the first filter 140e may transmit light having a wavelength longer than the lower limit of the near-infrared light wavelength. For example, the first filter 140e may transmit light having a wavelength longer than about 700 nm. The second filter 130 may transmit the visible light. For example, the second filter 130 may transmit light having a wavelength ranging from about 400 nm to about 700 nm.

In the fifth embodiment, light passing through the rejection filter 152 and the first filter 140e may have a wavelength ranging from about 800 nm to about 900 nm. The light passing through the rejection filter 152 and the first filter 140e may enter depth sensors 120, and may be used as light sources of the depth sensors 120. Light passing through the rejection filter 152 and the second filter 130 may have a wavelength ranging from about 400 nm to about 700 nm. The light passing through the rejection filter 152 and the second filter 130 may enter color sensors 110, and may be used as light sources of the color sensors 110.

A three-dimensional color image sensor illustrated in FIG. 26 may be manufactured by the method according to the first through fourth embodiments. However, amount of color pigments or color dyes may be adjusted so that the first filter 140e may have the transmittance illustrated in FIG. 27. Further, thicknesses and the number of a silicon oxide layer 152a and a titanium oxide layer 152b may be adjusted so that the rejection filter 152 may have the transmittance illustrated in FIG. 27.

Hereinafter, spectrum characteristic of the rejection filter 152 included in the three-dimensional color image sensor according to the fifth embodiment will be described below, Sample 6

A rejection filter of a sixth sample may be manufactured by the method described above in accordance with the fifth embodiment of the present inventive concept. The rejection filter may be formed by alternately stacking a silicon oxide layer and a titanium oxide layer. The thicknesses of the stacked silicon oxide layer and titanium oxide layer are described in table 2. The rejection filter of the sixth sample may have a thickness of about 2,993 nm.

TABLE 2

| Layer | Material | Thickness (um) |
|---|---|---|
| 1 | SiO2 | 65 |
| 2 | TiO2 | 80 |
| 3 | SiO2 | 10 |
| 4 | TiO2 | 9 |
| 5 | SiO2 | 154 |
| 6 | TiO2 | 17 |
| 7 | SiO2 | 6 |
| 8 | TiO2 | 6 |
| 9 | SiO2 | 1 |
| 10 | TiO2 | 85 |
| 11 | SiO2 | 30 |
| 12 | TiO2 | 15 |
| 13 | SiO2 | 161 |
| 14 | TiO2 | 7 |
| 15 | SiO2 | 30 |
| 16 | TiO2 | 97 |
| 17 | SiO2 | 151 |
| 18 | TiO2 | 96 |
| 19 | SiO2 | 156 |
| 20 | TiO2 | 21 |
| 21 | SiO2 | 1 |
| 22 | TiO2 | 81 |
| 23 | SiO2 | 31 |
| 24 | TiO2 | 10 |
| 25 | SiO2 | 175 |
| 26 | TiO2 | 10 |
| 27 | SiO2 | 33 |
| 28 | TiO2 | 101 |
| 29 | SiO2 | 163 |
| 30 | TiO2 | 90 |
| 31 | SiO2 | 14 |
| 32 | TiO2 | 8 |
| 33 | SiO2 | 337 |
| 34 | TiO2 | 15 |
| 35 | SiO2 | 20 |
| 36 | TiO2 | 78 |
| 37 | SiO2 | 25 |
| 38 | TiO2 | 15 |
| 39 | SiO2 | 216 |
| 40 | TiO2 | 5 |
| 41 | SiO2 | 12 |
| 42 | TiO2 | 12 |
| 43 | SiO2 | 31 |
| 44 | TiO2 | 62 |
| 45 | SiO2 | 15 |
| 46 | TiO2 | 29 |
| 47 | SiO2 | 194 |
| 48 | TiO2 | 10 |

Spectrum Characteristic Measurement

Figure 28:
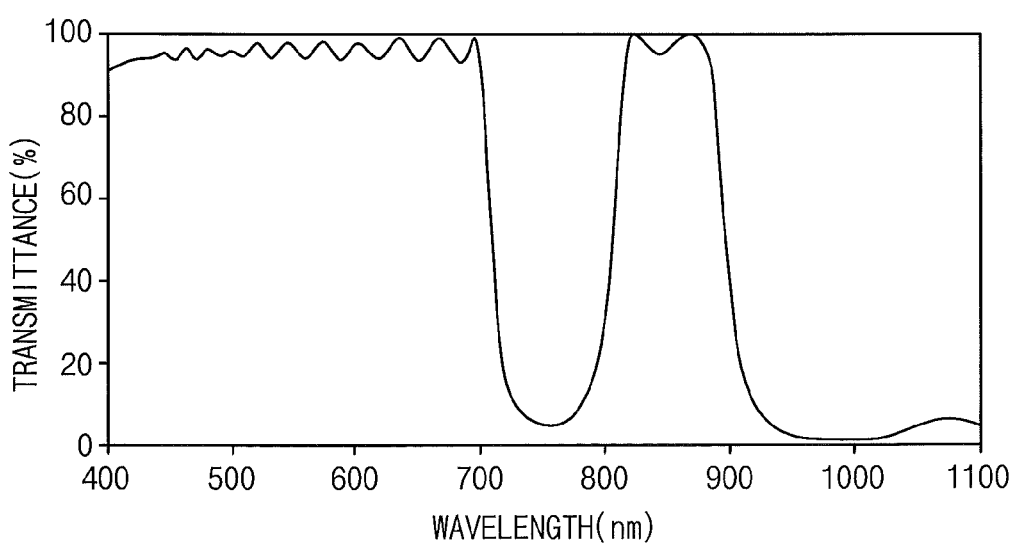
FIG. 28 is a graph illustrating a spectrum characteristic of a rejection filter of a sixth sample.

FIG. 28 is a graph illustrating a spectrum characteristic of a rejection filter of a sixth sample. Referring to FIG. 28, the rejection filter of the sixth sample may have a transmittance more than about 90% for light having a wavelength ranging from about 400 nm to about 870 nm and from about 820 nm to about 880 nm, and may not transmit the most of light having a wavelength ranging from about 700 nm to about 800 nm and a wavelength more than about 900 nm. Thus, the rejection filter of the sixth sample may be applicable to the rejection filter included in the three-dimensional color image sensor according to the fifth embodiment.

Embodiment 6

Figure 29:
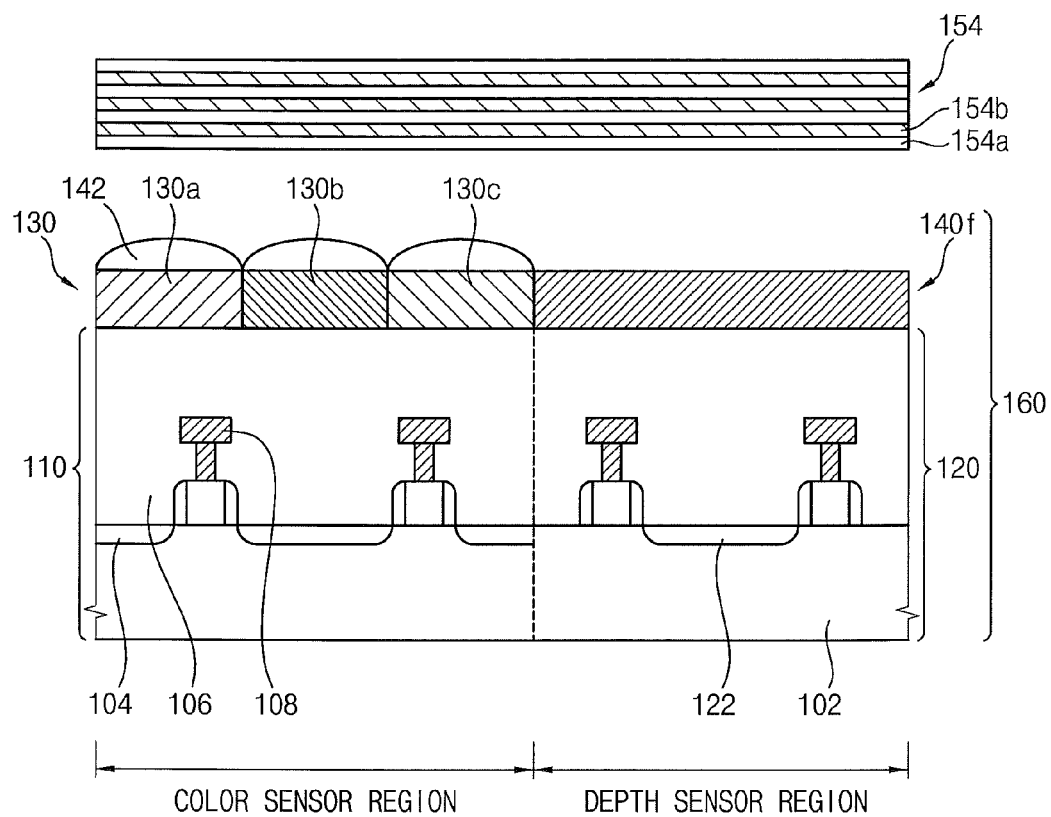
FIG. 29 is a cross-sectional view of a three-dimensional color image sensor in accordance with a sixth embodiment of the present inventive concept.

FIG. 29 is a cross-sectional view of a three-dimensional color image sensor in accordance with a sixth embodiment of the present inventive concept. As illustrated in FIG. 29, arrangements and configurations of a rejection filter 154, a first filter 140*f* and a second filter 130 included in a three-dimensional color image sensor according to a sixth embodiment may be substantially similar to those of the three-dimensional color image sensor according to the first embodiment. However, transmittances of the rejection filter 154 and the first filter 140*f* according to the sixth embodiment may be different from those of the first embodiment. Materials included in the rejection filter 154 and the first filter 140*f* according to the sixth embodiment may be substantially the same as those of the first through fourth embodiments. However, amounts of the materials and thicknesses of layers included in the rejection filter 154 and the first filter 140*f* may be different from those of the first through fourth embodiments.

Figure 30:
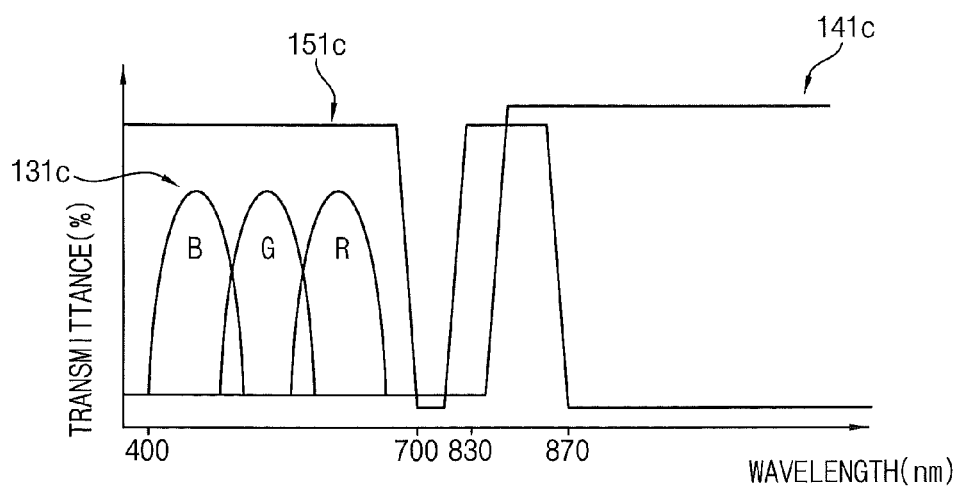
FIG. 30 is a graph illustrating transmittance of filters included in a three-dimensional color image sensor illustrated in FIG. 29.

FIG. 30 is a graph illustrating transmittance of filters included in a three-dimensional color image sensor illustrated in FIG. 29. In FIG. 30, 151*c* represents a spectral transmittance of the rejection filter 154, 141*c* represents a spectral transmittance of the first filter 140*f*, and 131*c* represents a spectral transmittance of the second filter 130.

As illustrated in FIG. 30, the rejection filter 154 may transmit visible light, and light having a wavelength longer than the upper limit of the visible light wavelength and shorter than the upper limit of near-infrared light wavelength. For example, the rejection filter 154 may transmit light having a wavelength ranging from about 400 nm to about 700 nm and from about 720 nm to about 900 nm. The first filter 140*f* may transmit light having a wavelength longer than the lower limit of the near-infrared light wavelength. For example, the first filter 140*f* may transmit light having a wavelength longer than about 800 nm. The second filter 130 may transmit the visible light. For example, the second filter 130 may transmit light having a wavelength ranging from about 400 nm to about 700 nm.

In the sixth embodiment, light passing through the rejection filter 154 and the first filter 140*f* may have a wavelength ranging from about 800 nm to about 900 nm. The light passing through the rejection filter 154 and the first filter 140*f* may enter depth sensors 120, and may be used as light sources of the depth sensors 120.

Light passing through the rejection filter 154 and the second filter 130 may have a wavelength ranging from about 400 nm to about 700 nm. The light passing through the rejection filter 152 and the second filter 130 may enter color sensors 110, and may be used as light sources of the color sensors 110.

A three-dimensional color image sensor illustrated in FIG. 29 may be manufactured by the method according to the first through fourth embodiments. However, amount of color pigments or color dyes may be adjusted so that the first filter 140*f* may have the transmittance illustrated in FIG. 30. Further, thicknesses and the number of a silicon oxide layer 154*a* and a titanium oxide layer 154*b* may be adjusted so that the rejection filter 154 may have the transmittance illustrated in FIG. 30.

Figure 31:
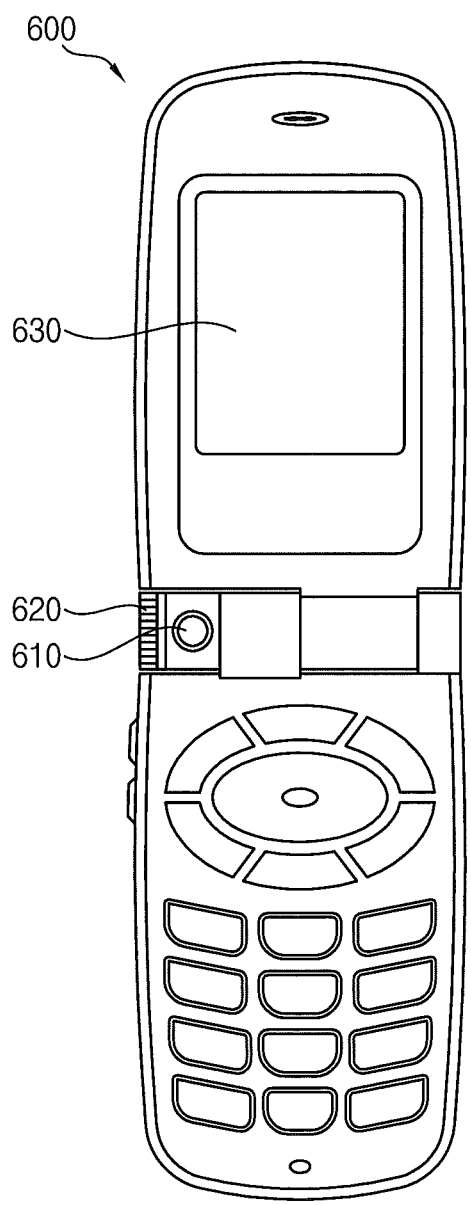
FIG. 31 is a diagram illustrating a mobile phone including a three-dimensional color image sensor that provides depth information as well as image information.

FIG. 31 is a diagram illustrating a mobile phone including a three-dimensional color image sensor that provides depth information as well as image information. Compared to a typical mobile phone, a mobile phone 600 according to example embodiments may further include a rejection filter in a camera lens module 610 and an image sensor 620 that provides depth information as well as image information. Thus, the image information and the depth information can be simultaneously displayed on a screen 630. The mobile phone 600 can obtain and display a three-dimensional color image.

Figure 32:
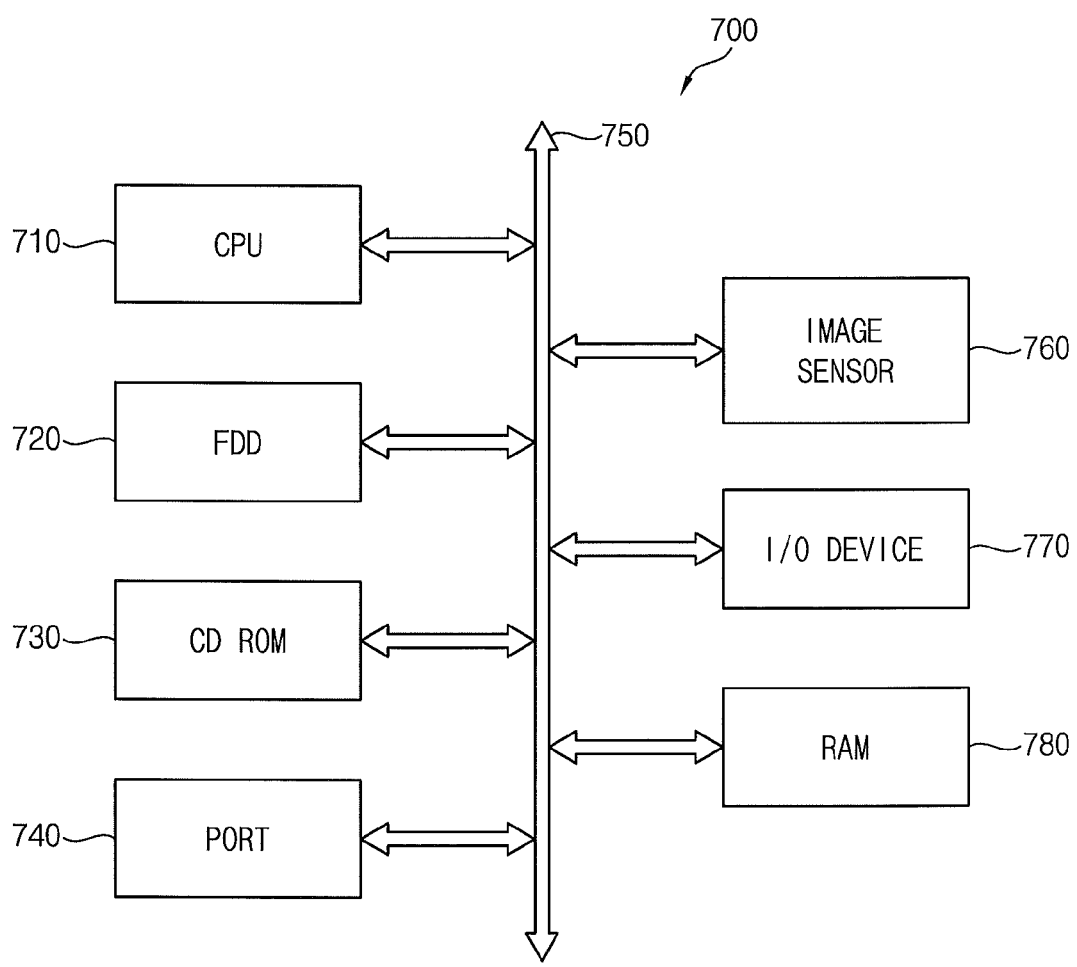
FIG. 32 is a block diagram illustrating a system including a three-dimensional color image sensor that provides depth information as well as image information.

FIG. 32 is a block diagram illustrating a system including a three-dimensional color image sensor that provides depth information as well as image information. Referring to FIG. 32, a system 700 may include a three-dimensional color image sensor 760 that provides depth information as well as image information. For example, the system 700 may include a computer system, a camera system, a scanner, a navigation system, etc. The system 700 may provide a three-dimensional color image using the three-dimensional color image sensor 760.

The processor-based system 700, such as a computer system, may include a central processing unit (CPU) 710, such as a micro processor, that communicates with an input/output device 770 via a bus 750. The CPU 710 may exchange data with a floppy disk drive 720, CD ROM drive 730, port 740 and/or RAM 780 via the bus 750. The CPU 710 may control the three-dimensional color image sensor 760 to obtain the three-dimensional color image. The port 740 may be connected to a video card, a sound card, a memory card, a USB device, etc., or may be used to communicate with another system.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A three-dimensional (3D) color image sensor, comprising:
    a 3-D image sensor pixel having a plurality of color sensors and a depth sensor therein, said plurality of color sensors including red, green and blue sensors extending adjacent the depth sensor; and
    a rejection filter extending opposite a light receiving surface of said 3-D image sensor pixel, said rejection filter configured to be selectively transmissive of visible and near-infrared light having wavelengths ranging from about 400 nm to about 900 nm, wherein said rejection filter comprises a plurality of silicon dioxide layers and a plurality of titanium oxide layers stacked in an alternating sequence, and wherein the refractive indexes, extinction coefficients and/or thicknesses of the plurality of silicon and titanium oxide layers are arranged to transmit light of desired wavelengths.

2. The 3D color image sensor of claim 1, wherein the depth sensor comprises an infrared filter that is selectively transmissive of near-infrared light having wavelengths greater than about 700 nm relative to visible light.

3. The 3D color image sensor of claim 2, wherein the infrared filter comprises a photoresist material having more than about 90% light transmittance for wavelengths longer than 850 nm, about 28% light transmittance for wavelengths of about 700 nm and about 16% light transmittance for wavelengths shorter than about 700 nm.

4. The 3D color image sensor of claim 2, wherein the infrared filter comprises a photoresist material having more than about 91% light transmittance for wavelengths longer than 850 nm, about 31.4% light transmittance for wavelengths of about 700 nm and about 13.4% light transmittance for wavelengths shorter than about 700 nm.

5. The 3D color image sensor of claim 2, wherein the infrared filter comprises a material selected from a group consisting of spin-on glass, an acrylic resin, a polymer resin and an epoxy resin in combination with at least one color dye and/or color pigment.

6. A method of manufacturing an image sensor, the method comprising:
    forming color sensors and depth sensors on a substrate;
    forming a first filter on the depth sensors, the first filter transmitting light having a wavelength longer than the upper limit of a visible light wavelength;
    forming a second filter on the color sensors, the second filter transmitting visible light; and
    forming a rejection filter over the first filter and the second filter, the rejection filter transmitting light having a wavelength shorter than the upper limit of a near-infrared light wavelength, wherein forming the rejection filter comprises alternately stacking a plurality of silicon oxide layers and a plurality of titanium oxide layers, and wherein stacking comprises adjusting a thickness of each stacked layer using spectra simulation.

7. The method of claim 6, wherein forming the first filter includes:
    forming a filter layer on the substrate by coating a photoresist including a pigment mixture where at least two pigments selected from a group consisting of a red pigment, a green pigment, a blue pigment, a yellow pigment and a violet pigment; and
    patterning the coated filter layer by a photolithography process.

8. The method of claim 6, wherein forming the first filter includes:
    forming a filter layer on the substrate, the filter layer transmitting the light having the wavelength longer than the upper limit of the visible light wavelength;
    forming an etching mask pattern on the filter layer; and
    etching the filter layer using the etching mask pattern.

9. The method of claim 6, wherein forming the first filter includes:
    forming a filter layer on the substrate, the filter layer transmitting the light having the wavelength longer than the upper limit of the visible light wavelength;
    forming a filter layer pattern by pressing a mold pattern to the filter layer having a groove corresponding to a region of the depth sensors; and
    removing residues outside the filter layer pattern.

10. The method of claim 9, wherein the filter layer is formed of an imprinting resin, and at least one of color pigments and color dyes.

11. The method of claim 6, wherein forming the rejection filter includes:
    alternately depositing inorganic compounds having different refractive indexes.

12. The 3D color image sensor of claim 1, wherein the rejection filter is transmissive of light having a wavelength ranging from about 400 nm to about 700 nm and from about 800 nm to about 900 nm.

13. The 3D color image sensor of claim 1, wherein the stacked layers comprise at least 30 layers, each layer having a respective thicknesses between 5 µm and 160 µm and wherein a majority of the at least 30 layers are less than 50 µm.

14. The 3D color image sensor of claim 1, wherein the rejection filter is transmissive of more than about 90% of incident light having a wavelength ranging from about 450 nm to about 850 nm and less than about 10% of the incident light having a wavelength greater than about 900 nm.

15. The 3D color image sensor of claim 1, wherein the rejection filter is transmissive of more than about 90% of incident light having a wavelength ranging from about 400 nm to about 870 nm and less than about 10% of the incident light having a wavelength ranging from about 700 nm to about 800 nm and a wavelength greater than about 900 nm.

16. The 3D color image sensor of claim 1, wherein the rejection filter is transmissive of more than about 90% of incident light having a wavelength ranging from about 400 nm to about 700 nm and about 720 nm to about 900 nm.

17. The 3D color image sensor of claim 2, wherein the infrared filter comprises about 1 to about 10% wt binder resin, about 1 to about 10 wt % photopolymerizable compound, about 1 to about 10 wt % photoinitiator, about 3 to about 20 wt % pigment mixture, about 0.1 to about 5 wt % additive and about 45 to about 80 wt % solvent.

18. The 3D color image sensor of claim 2, wherein the infrared filter has a transmittance of more than about 88.5% light transmittance for wavelengths greater than 850 nm, about 3.52% light transmittance for wavelengths of about 700 nm and about 0.62% light transmittance for wavelengths less than about 700 nm.

19. The 3D color image sensor of claim 2, wherein the infrared filter comprises a photoresist material having more than about 91% light transmittance for wavelengths greater than 850 nm, about 21.8% light transmittance for wavelengths of about 700 nm and about 6.4% light transmittance for wavelengths less than about 700 nm.

20. The method of claim 6, further comprising:
performing an exposure process to form a pattern having a line width less than 20 μm.

* * * * *